United States Patent
Masuoka et al.

(10) Patent No.: US 9,466,683 B2
(45) Date of Patent: *Oct. 11, 2016

(54) SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/963,412

(22) Filed: Dec. 9, 2015

(65) Prior Publication Data

US 2016/0126332 A1 May 5, 2016

Related U.S. Application Data

(60) Continuation of application No. 14/607,783, filed on Jan. 28, 2015, now Pat. No. 9,252,276, which is a continuation of application No. 14/469,107, filed on Aug. 26, 2014, now Pat. No. 9,029,923, which is a (Continued)

(51) Int. Cl.
 *H01L 29/76* (2006.01)
 *H01L 27/088* (2006.01)
 (Continued)

(52) U.S. Cl.
 CPC ..... *H01L 29/42392* (2013.01); *H01L 29/0692* (2013.01); *H01L 29/16* (2013.01);
 (Continued)

(58) Field of Classification Search
 CPC ...... H01L 21/336; H01L 29/78; H01L 29/76

USPC ....... 438/283, 197, 268, 151, 300, 157, 296, 438/510; 257/288, 401, 66, 77, 347, 368, 257/213, 350, 190, 330, 202, 301, 296, 390
See application file for complete search history.

(56) References Cited

U.S. PATENT DOCUMENTS 5,382,816 A 1/1995 Mitsui
6,300,198 B1 10/2001 Aeugle et al.
(Continued)

FOREIGN PATENT DOCUMENTS

CN 1251207 4/2000
JP 02-071556 3/1990
(Continued)

OTHER PUBLICATIONS

Corrected Notice of Allowance for U.S. Appl. No. 14/100,496 dated Sep. 26, 2014, 2 pages.
(Continued)

*Primary Examiner* — Jessica Manno
*Assistant Examiner* — Sheikh Maruf
(74) *Attorney, Agent, or Firm* — Brinks Gilson & Lione

(57) ABSTRACT

A semiconductor device includes a pillar-shaped silicon layer on a fin-shaped silicon layer. A gate insulating film and a metal gate electrode are around the pillar-shaped silicon layer and a metal gate line extends in a direction perpendicular to the fin-shaped silicon layer and is connected to the metal gate electrode. A contact resides on the metal gate line and a nitride film is on an entire top surface of the metal gate electrode and the metal gate line, except for the bottom of the contact. A vertical thickness of the nitride film relative to the substrate is greater than a horizontal thickness of the nitride film on the sidewall of the metal gate electrode and gate line relative to the substrate.

1 Claim, 39 Drawing Sheets

Related U.S. Application Data continuation of application No. 14/177,459, filed on Feb. 11, 2014, now Pat. No. 8,823,066, which is a division of application No. 13/891,655, filed on May 10, 2013, now Pat. No. 8,697,511.

(60) Provisional application No. 61/648,817, filed on May 18, 2012.

(51) Int. Cl.

| | | |
|---|---|---|
| *H01L 29/66* | (2006.01) | |
| *H01L 29/423* | (2006.01) | |
| *H01L 29/78* | (2006.01) | |
| *H01L 29/45* | (2006.01) | |
| *H01L 29/49* | (2006.01) | |
| *H01L 29/16* | (2006.01) | |
| *H01L 29/417* | (2006.01) | |
| *H01L 29/06* | (2006.01) | |
| *H01L 29/786* | (2006.01) | |

(52) U.S. Cl.
CPC ..... *H01L29/41741* (2013.01); *H01L 29/4238* (2013.01); *H01L 29/456* (2013.01); *H01L 29/495* (2013.01); *H01L 29/66477* (2013.01); *H01L 29/66666* (2013.01); *H01L 29/785* (2013.01); *H01L 29/7827* (2013.01); *H01L 29/7851* (2013.01); *H01L 29/78642* (2013.01); *H01L 29/78654* (2013.01)

(56) References Cited

U.S. PATENT DOCUMENTS

| | | | |
|---|---|---|---|
| 6,461,900 B1 | 10/2002 | Sundaresan et al. | |
| 6,642,575 B1 | 11/2003 | Ono et al. | |
| 6,747,314 B2 | 6/2004 | Sundaresan et al. | |
| 7,115,476 B1 | 10/2006 | Izumida | |
| 7,304,343 B2 | 12/2007 | Masuoka et al. | |
| 7,348,243 B2 | 3/2008 | Kim | |
| 7,442,976 B2 | 10/2008 | Juengling | |
| 7,482,229 B2 | 1/2009 | Juengling | |
| 7,683,428 B2 | 3/2010 | Chidambarrao et al. | |
| 8,080,458 B2 | 12/2011 | Masuoka et al. | |
| 8,188,537 B2* | 5/2012 | Masuoka | H01L 21/84 257/329 |
| 8,823,066 B2* | 9/2014 | Masuoka | H01L 29/66477 257/288 |
| 9,029,923 B2* | 5/2015 | Masuoka | H01L 29/66477 257/283 |
| 9,054,085 B2 | 6/2015 | Masuoka et al. | |
| 9,202,922 B2 | 12/2015 | Masuoka et al. | |
| 9,246,001 B2 | 1/2016 | Masuoka et al. | |
| 9,252,276 B2* | 2/2016 | Masuoka | H01L 29/66477 |
| 2003/0075758 A1 | 4/2003 | Sundaresan et al. | |
| 2004/0150037 A1 | 8/2004 | Katsumata et al. | |
| 2004/0150071 A1 | 8/2004 | Kondo | |
| 2005/0142771 A1 | 6/2005 | Kim | |
| 2005/0224847 A1 | 10/2005 | Masuoka et al. | |
| 2006/0046407 A1 | 3/2006 | Juengling | |
| 2006/0258109 A1 | 11/2006 | Juengling | |
| 2006/0292765 A1* | 12/2006 | Blanchard | B82Y 10/00 438/157 |
| 2007/0057325 A1 | 3/2007 | Hsu | |
| 2007/0247906 A1 | 10/2007 | Watanabe et al. | |
| 2007/0257277 A1 | 11/2007 | Takeda et al. | |
| 2007/0284661 A1* | 12/2007 | Yamada | H01L 21/84 257/347 |
| 2008/0061322 A1 | 3/2008 | von Kluge | |
| 2008/0061370 A1 | 3/2008 | Matsuo | |
| 2008/0121961 A1 | 5/2008 | Schloesser | |
| 2008/0136030 A1 | 6/2008 | Chang et al. | |
| 2008/0173936 A1 | 7/2008 | Yoon et al. | |
| 2008/0277725 A1 | 11/2008 | Shino | |
| 2008/0296666 A1 | 12/2008 | Iijima | |
| 2009/0042347 A1 | 2/2009 | Oyu | |
| 2009/0050984 A1 | 2/2009 | Balasubramanian | |
| 2009/0078993 A1 | 3/2009 | Fujimoto | |
| 2009/0096000 A1 | 4/2009 | Juengling | |
| 2009/0194814 A1 | 8/2009 | Sugioka | |
| 2009/0200604 A1 | 8/2009 | Chidambarrao et al. | |
| 2010/0148233 A1* | 6/2010 | Fujimoto | H01L 27/108 257/296 |
| 2010/0200835 A1 | 8/2010 | Jin et al. | |
| 2010/0207201 A1 | 8/2010 | Masuoka et al. | |
| 2010/0213539 A1* | 8/2010 | Masuoka | H01L 21/84 257/329 |
| 2010/0264485 A1 | 10/2010 | Masuoka et al. | |
| 2011/0049629 A1 | 3/2011 | Ishikawa et al. | |
| 2011/0068401 A1 | 3/2011 | Izumida et al. | |
| 2011/0104862 A1 | 5/2011 | Kadoya | |
| 2012/0008367 A1 | 1/2012 | Kajiyama | |
| 2013/0140627 A1 | 6/2013 | Masuoka et al. | |
| 2013/0153989 A1 | 6/2013 | Masuoka et al. | |
| 2013/0248967 A1 | 9/2013 | Ohba | |
| 2013/0320456 A1 | 12/2013 | Golonzka et al. | |

FOREIGN PATENT DOCUMENTS

| | | |
|---|---|---|
| JP | 02-145761 | 6/1990 |
| JP | 02-188966 | 7/1990 |
| JP | 03-145761 | 6/1991 |
| JP | 06-021389 | 1/1994 |
| JP | 06-021467 | 1/1994 |
| JP | 07-245291 | 9/1995 |
| JP | 07-263677 | 10/1995 |
| JP | 08-227997 | 9/1996 |
| JP | 10-209407 | 8/1998 |
| JP | 11-297984 | 10/1999 |
| JP | 2001-284598 | 10/2001 |
| JP | 2003-179160 | 6/2003 |
| JP | 2005-197704 | 7/2005 |
| JP | 2006-108514 | 4/2006 |
| JP | 2006-310651 | 11/2006 |
| JP | 2006-351745 | 12/2006 |
| JP | 2007-520883 | 7/2007 |
| JP | 2007-329480 | 12/2007 |
| JP | 2008-511997 | 4/2008 |
| JP | 2008-177565 | 7/2008 |
| JP | 2009-081163 | 4/2009 |
| JP | 2009-182317 | 8/2009 |
| JP | 2010-135592 A | 6/2010 |
| JP | 2010-251586 | 11/2010 |
| JP | 2010-251678 | 11/2010 |
| JP | 2010-258345 | 11/2010 |
| JP | 2011-228519 A | 11/2011 |
| JP | 2011-258780 | 12/2011 |
| JP | 2012-004244 | 1/2012 |
| WO | WO 2005/079182 | 9/2005 |
| WO | WO 2006/028777 | 3/2006 |
| WO | WO 2009/102061 | 8/2009 |

OTHER PUBLICATIONS

International Search Report for PCT/JP2012/062597 (including English translation), dated Aug. 21, 2012, 5 pages.

International Search Report for PCT/JP2012/062857 (including English translation), dated Aug. 21, 2012, 5 pages.

Notice of Allowance for U.S. Appl. No. 14/177,459 dated Jul. 17, 2014, 10 pages.

Notice of Allowance for U.S. Appl. No. 13/666,445 dated Apr. 9, 2014, 9 pages.

Notice of Allowance for U.S. Appl. No. 14/100,496 dated Aug. 14, 2014, 9 pages.

Notice of Allowance for U.S. Appl. No. 13/891,655 dated Feb. 3, 2014 (14 pages).

Office Action for U.S. Appl. No. 13/289,742, dated Dec. 5, 2012, 13 pages.

Office Action for U.S. Appl. No. 14/061,082 dated May 14, 2014, 9 pages.

Office Action for U.S. Appl. No. 14/061,082 dated Jan. 13, 2014, 6 pages.

(56) References Cited

OTHER PUBLICATIONS

Office Action for U.S. Appl. No. 14/100,496 dated Jun. 4, 2014, 11 pages.
Office Action for U.S. Appl. No. 14/469,107 dated Dec. 17, 2014, 9 pages.
Notice of Allowance for U.S. Appl. No. 14/469,107 dated Feb. 27, 2015, 10 pages.
Office Action for U.S. Appl. No. 14/479,799 dated Feb. 9, 2015, 6 pages.
Office Action for U.S. Appl. No. 14/479,799 dated Dec. 16, 2014, 6 pages.
Search Report and Written Opinion for Singapore Patent Application Serial No. 201108125-4, dated Oct. 5, 2012, 12 pages.
Extended European Search Report for European Application No. 10003947.8, dated Nov. 17, 2010, 9 pages.
Mistry et al., "A 45nm Logic Technology with High-k+Metal Gate Transistors, Strained Silicon, 9 Cu Interconnect Layers, 193nm Dry Patterning, and 100% Pb-free Packaging", *IEEE*, pp. 247-250, 2007.
Office Action from counterpart Chinese Application No. 201010167317.6, dated Nov. 24, 2011, 12 pages.
Wu et al., "High Performance 22/20nm FinFET CMOS Devices with Advanced High-K/Metal Gate Scheme", *IEEE*, pp. 27.1.1-27.1.4, 2010.
Office Action for U.S. Appl. No. 14/667,187 dated May 22, 2015, 8 pages.
Notice of Allowance for U.S. Appl. No. 14/667,187 dated Sep. 2, 2015, 8 pages.
Notice of Allowance for U.S. Appl. No. 14/479,799 dated Mar. 27, 2015, 9 pages.
Notice of Allowance for U.S. Appl. No. 14/479,799 dated Apr. 22, 2015, 2 pages.
Notice of Allowance for U.S. Appl. No. 14/469,107 dated Mar. 31, 2015, 2 pages.
Office Action for U.S. Appl. No. 14/699,305 dated Aug. 20, 2015, 8 pages.
Office Action for U.S. Appl. No. 14/607,783 dated Sep. 2, 2015, 12 pages.
Office Action for Japanese Patent Application Serial No. 2014-245700 dated Sep. 30, 2015, 4 pages (not in English).
Notice of Allowance for U.S. Appl. No. 14/607,783 dated Oct. 22, 2015, 9 pages.
Notice of Allowance for U.S. Appl. No. 14/699,305 dated Oct. 29, 2015, 8 pages.
Notice of Allowance in corresponding U.S. Appl. No. 14/964,701, dated Jul. 13, 2016, 9 pages.
Office Action in corresponding U.S. Appl. No. 14/920,448, dated Mar. 10, 2016, 8 pages.
Notice of Allowance in corresponding U.S. Appl. No. 14/920,448, dated May 18, 2016, 8 pages.
Office Action in corresponding U.S. Appl. No. 14/964,701, dated Apr. 25, 2016, 8 pages.

\* cited by examiner

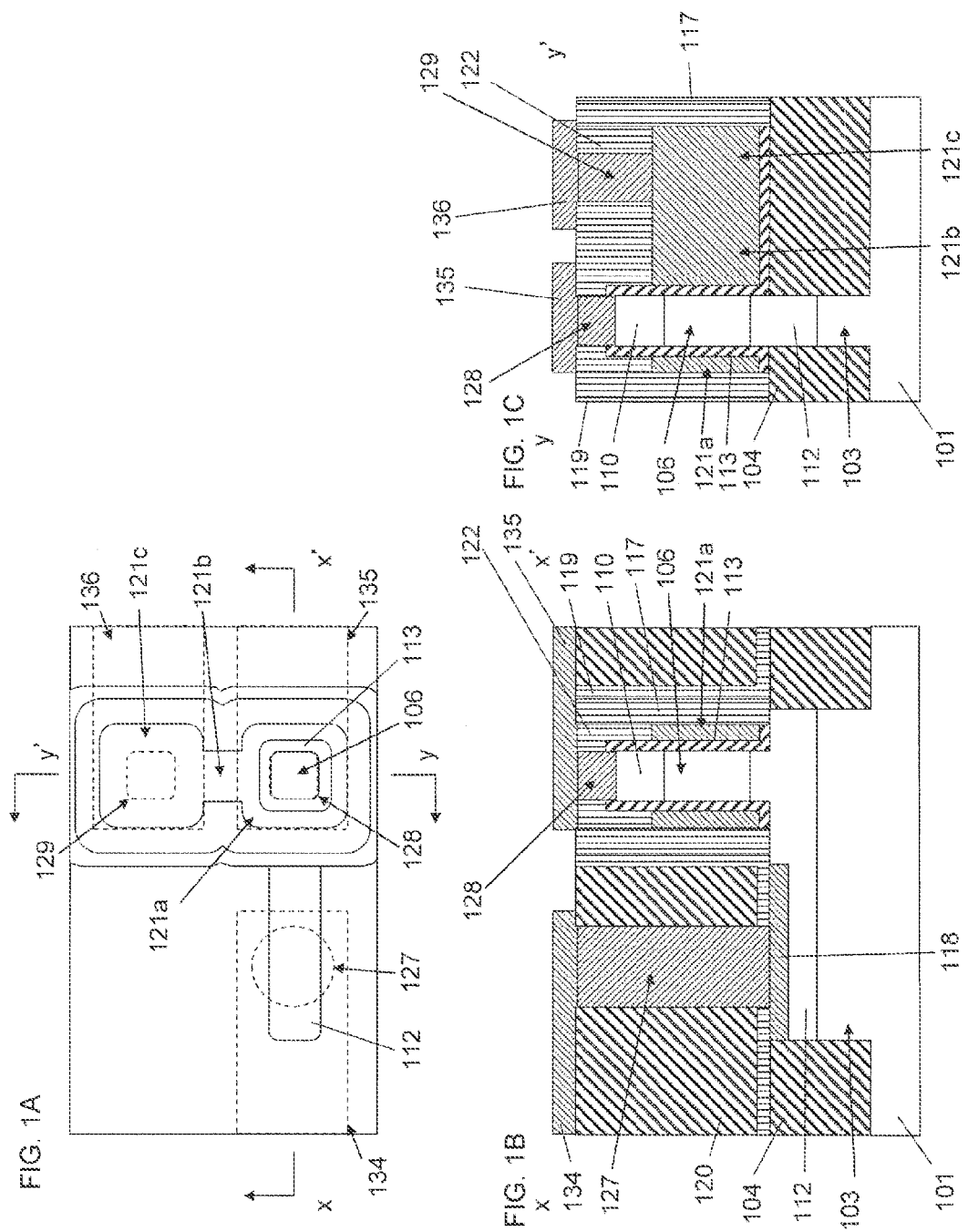

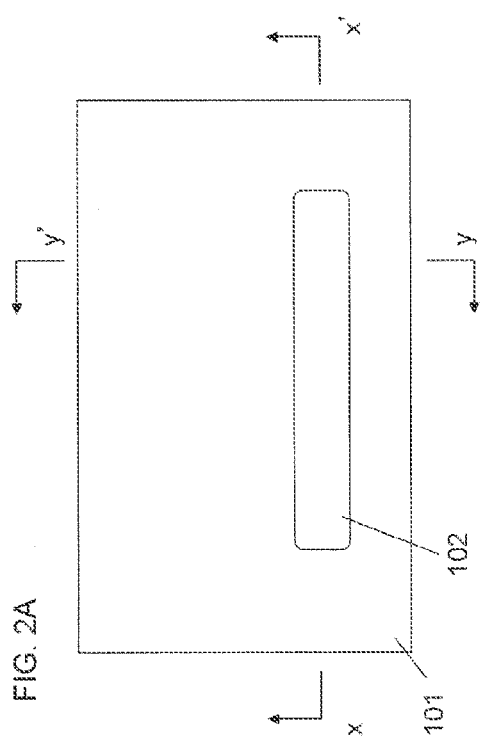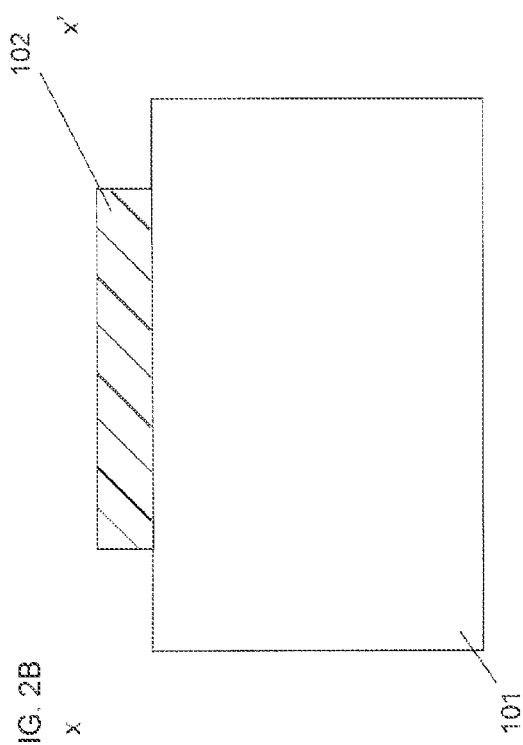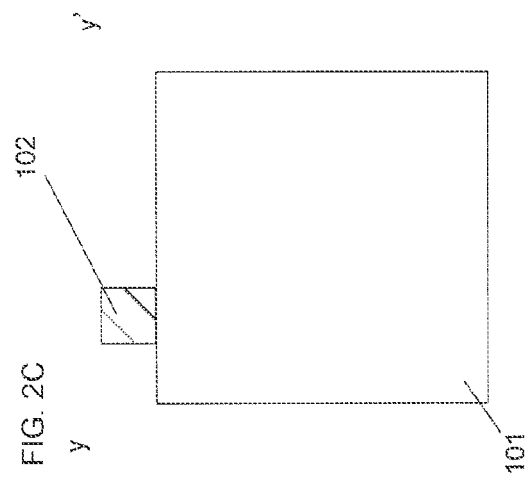

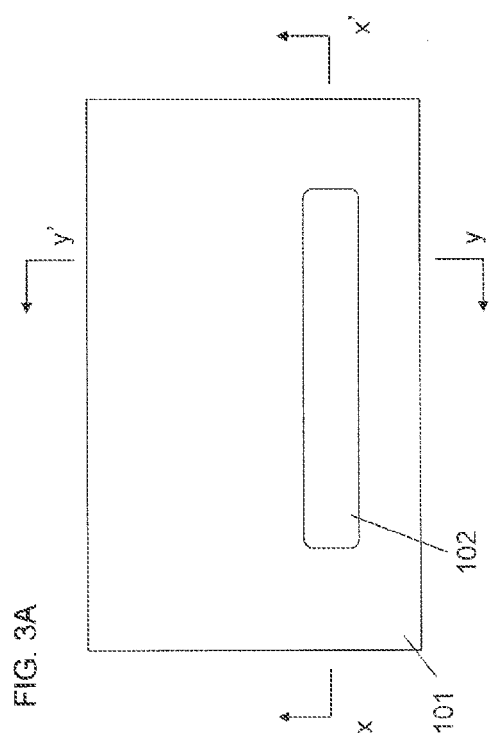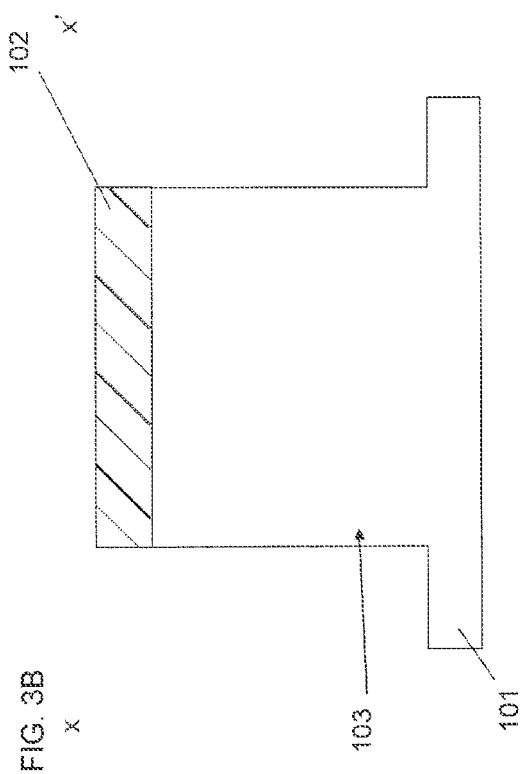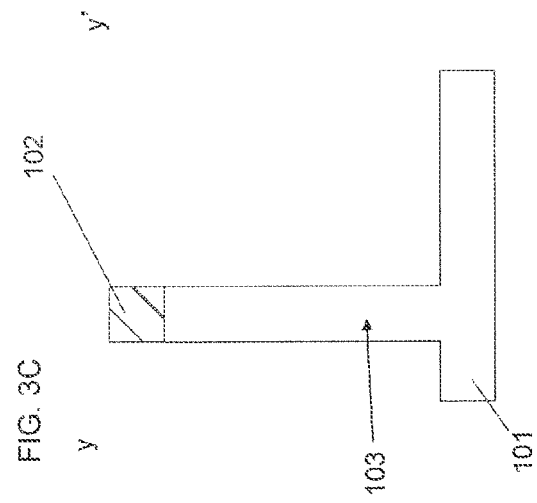

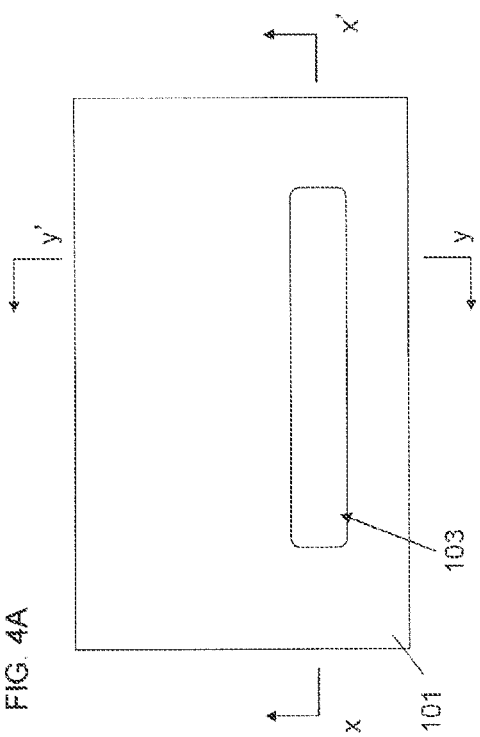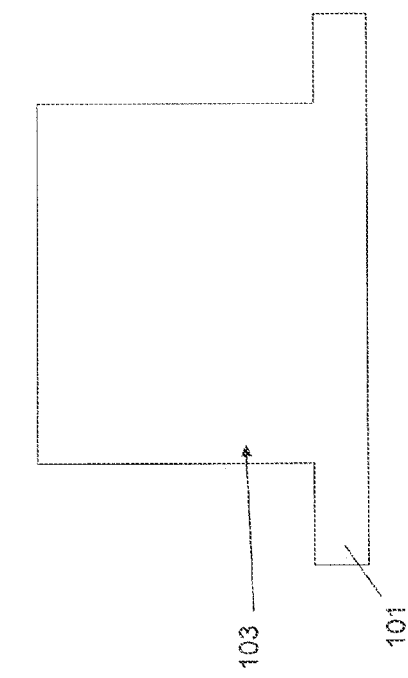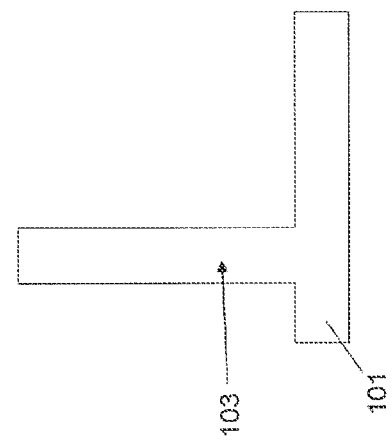

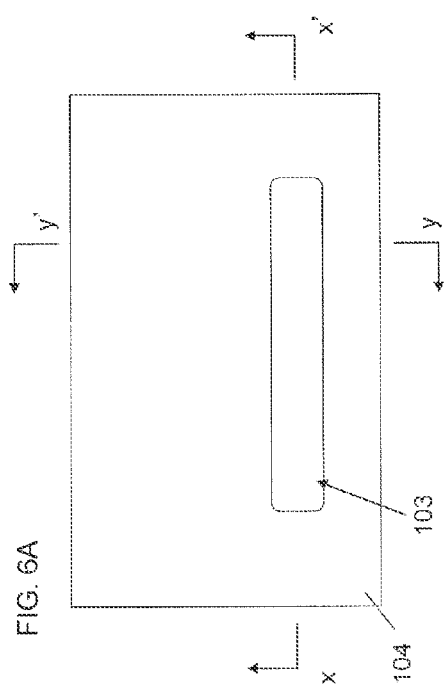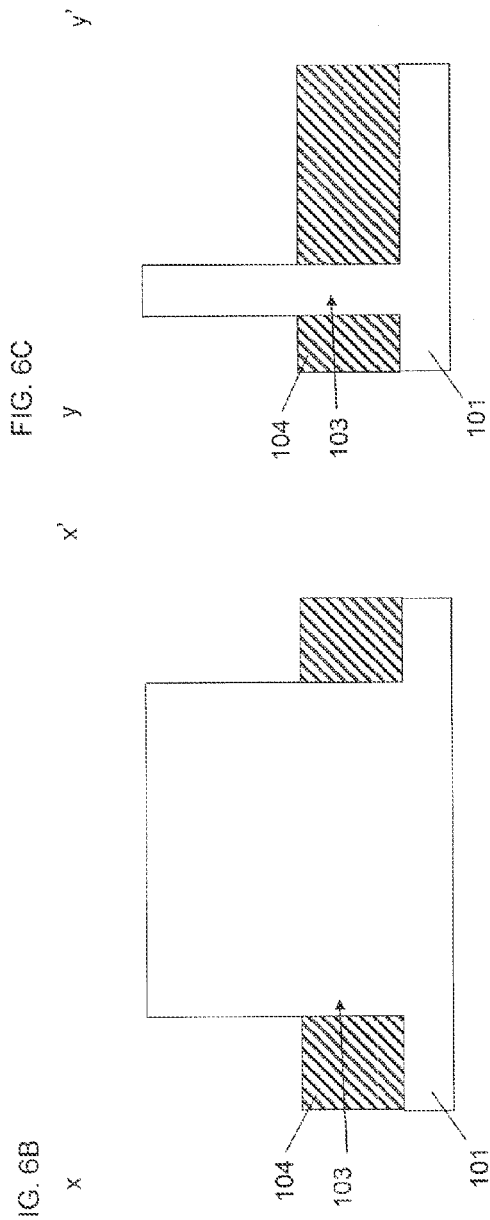

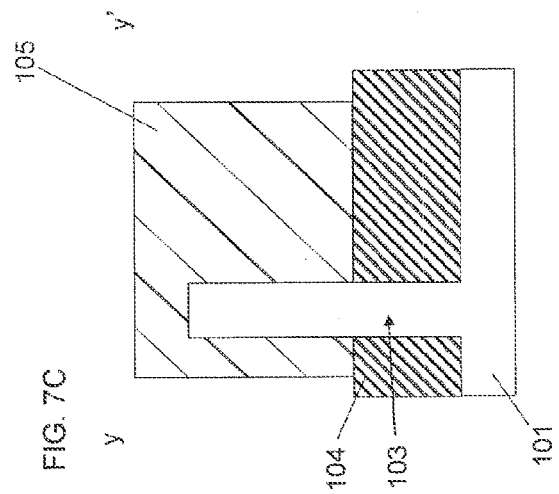
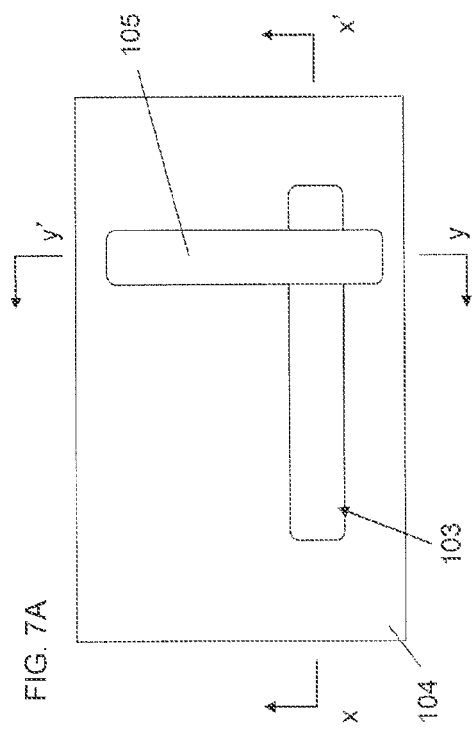
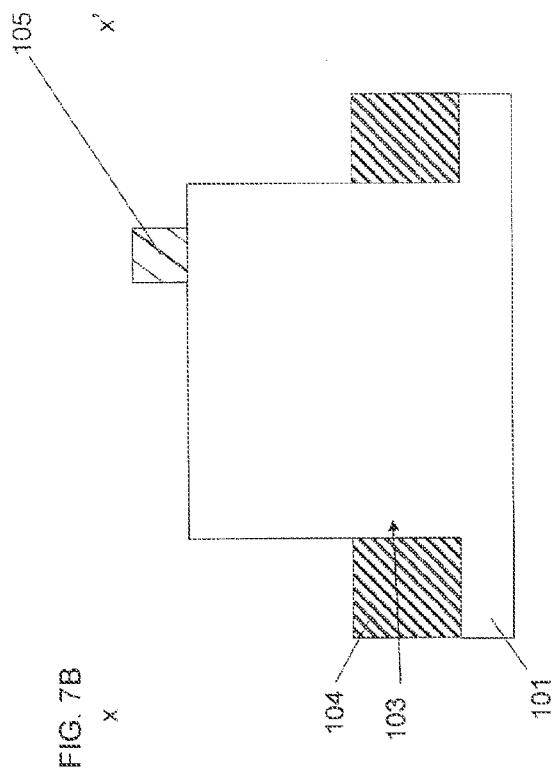

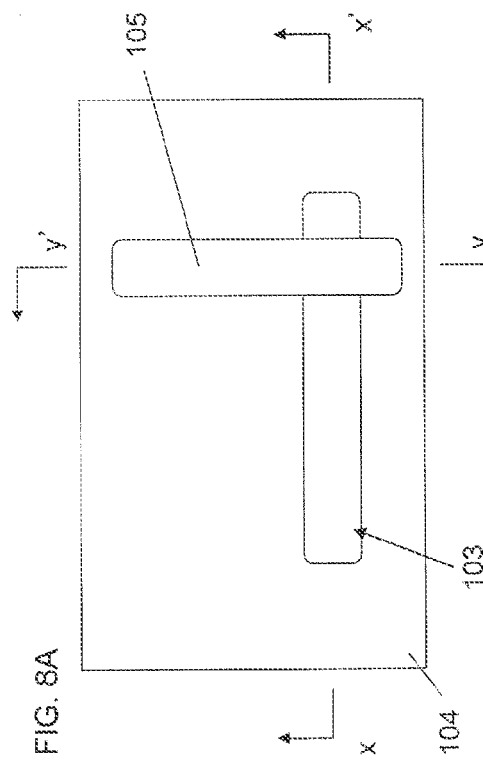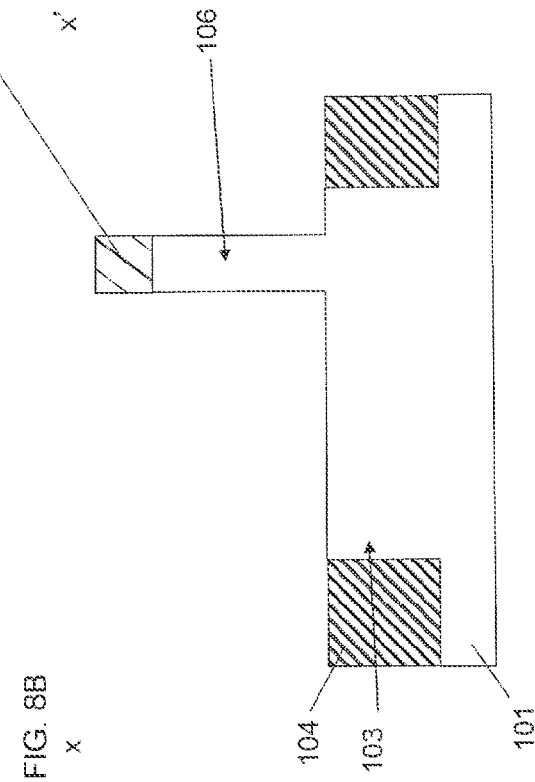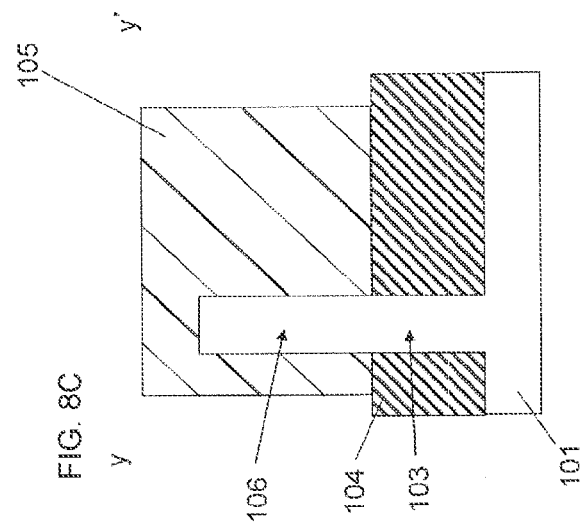

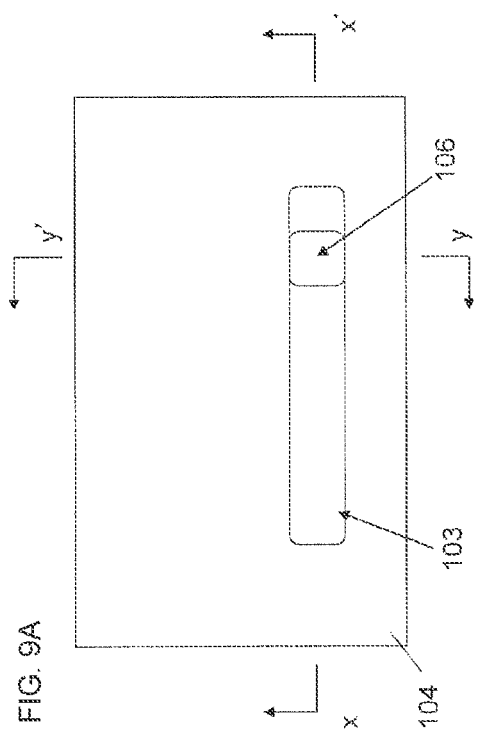
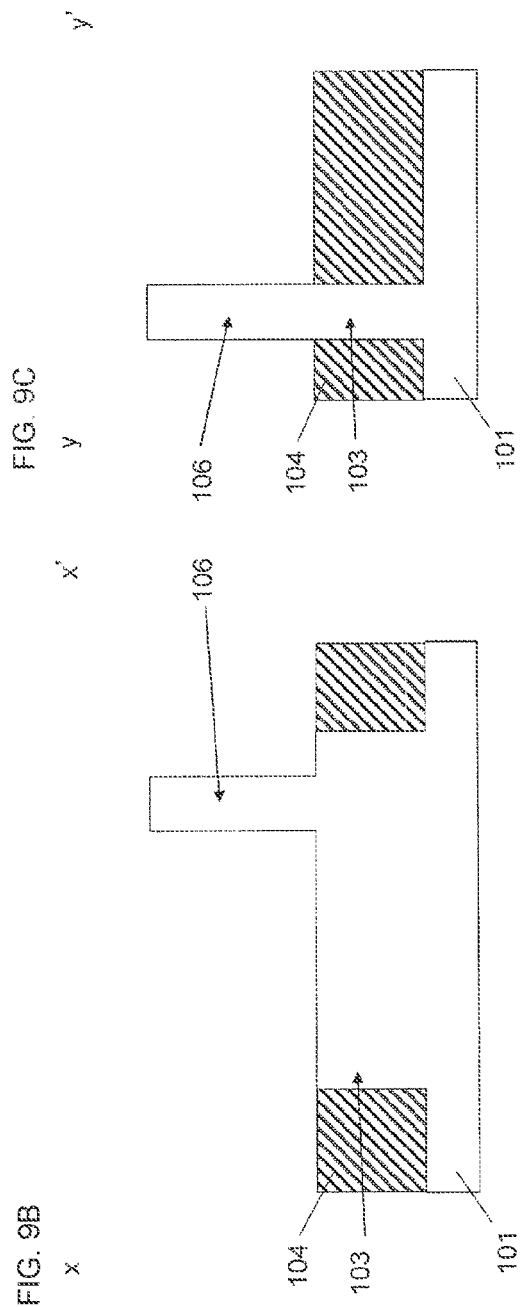

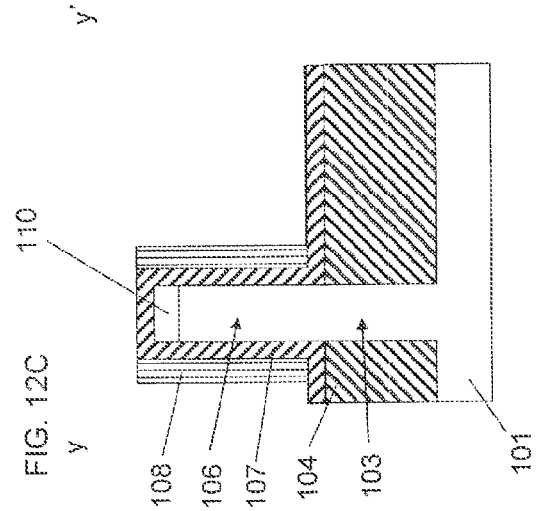
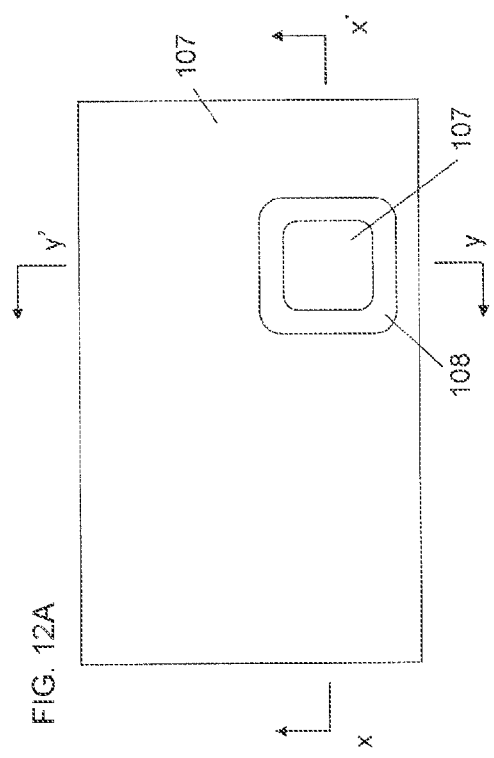
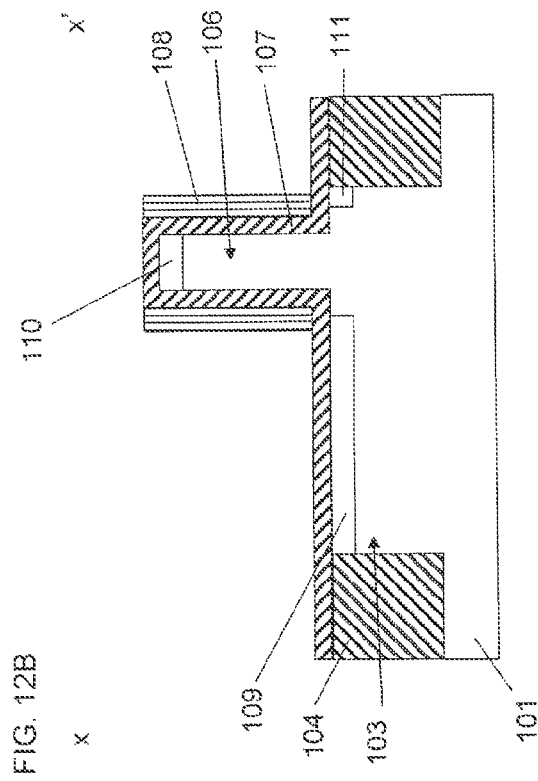

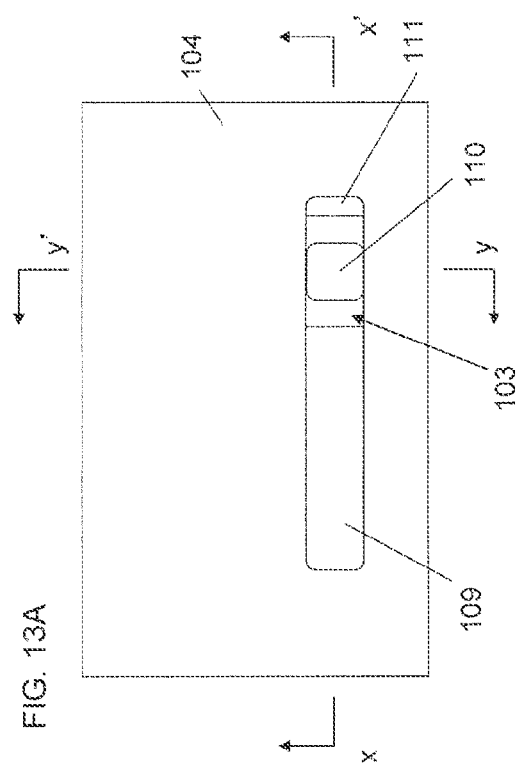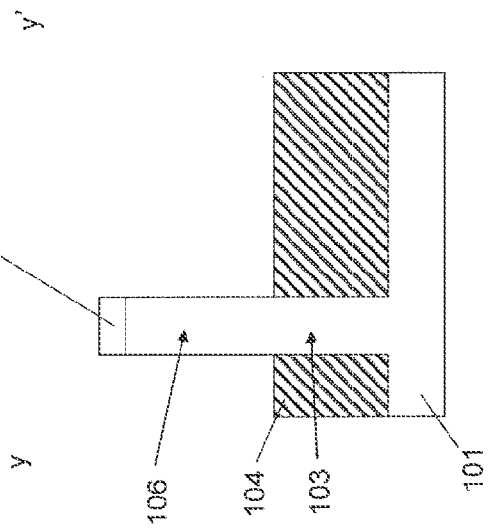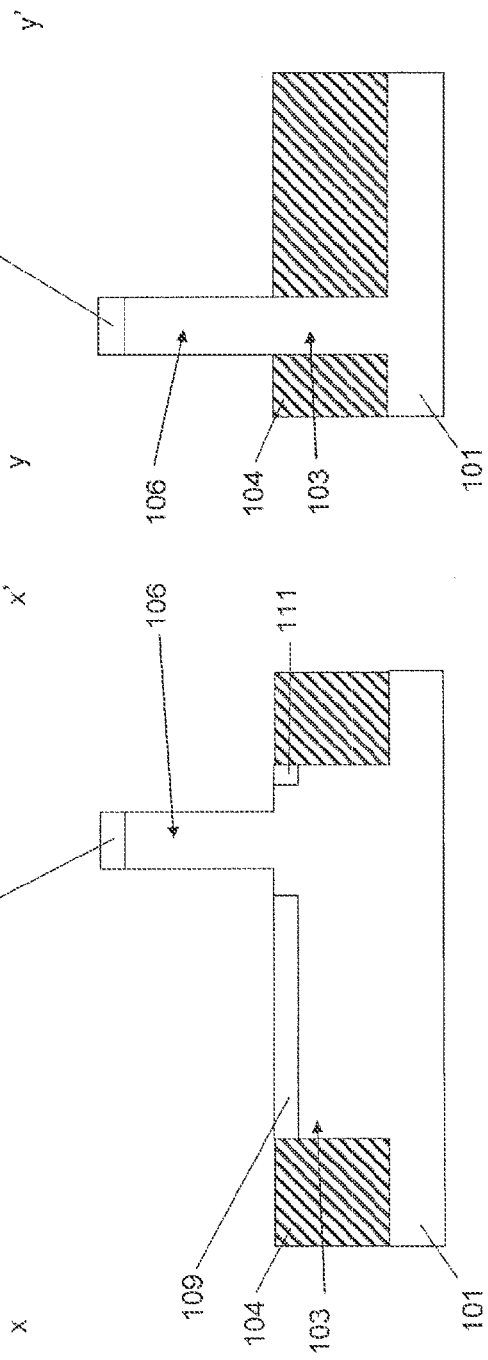

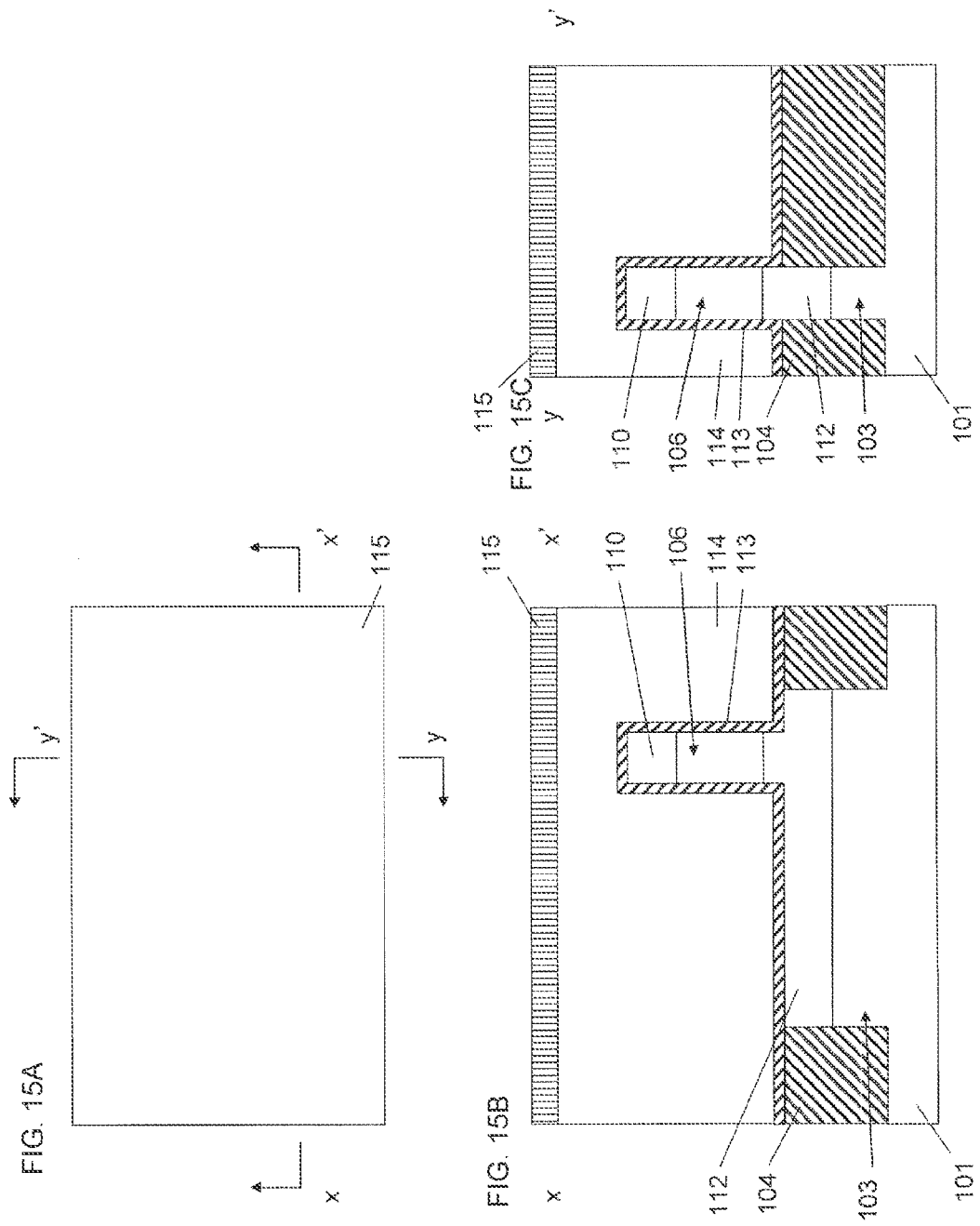

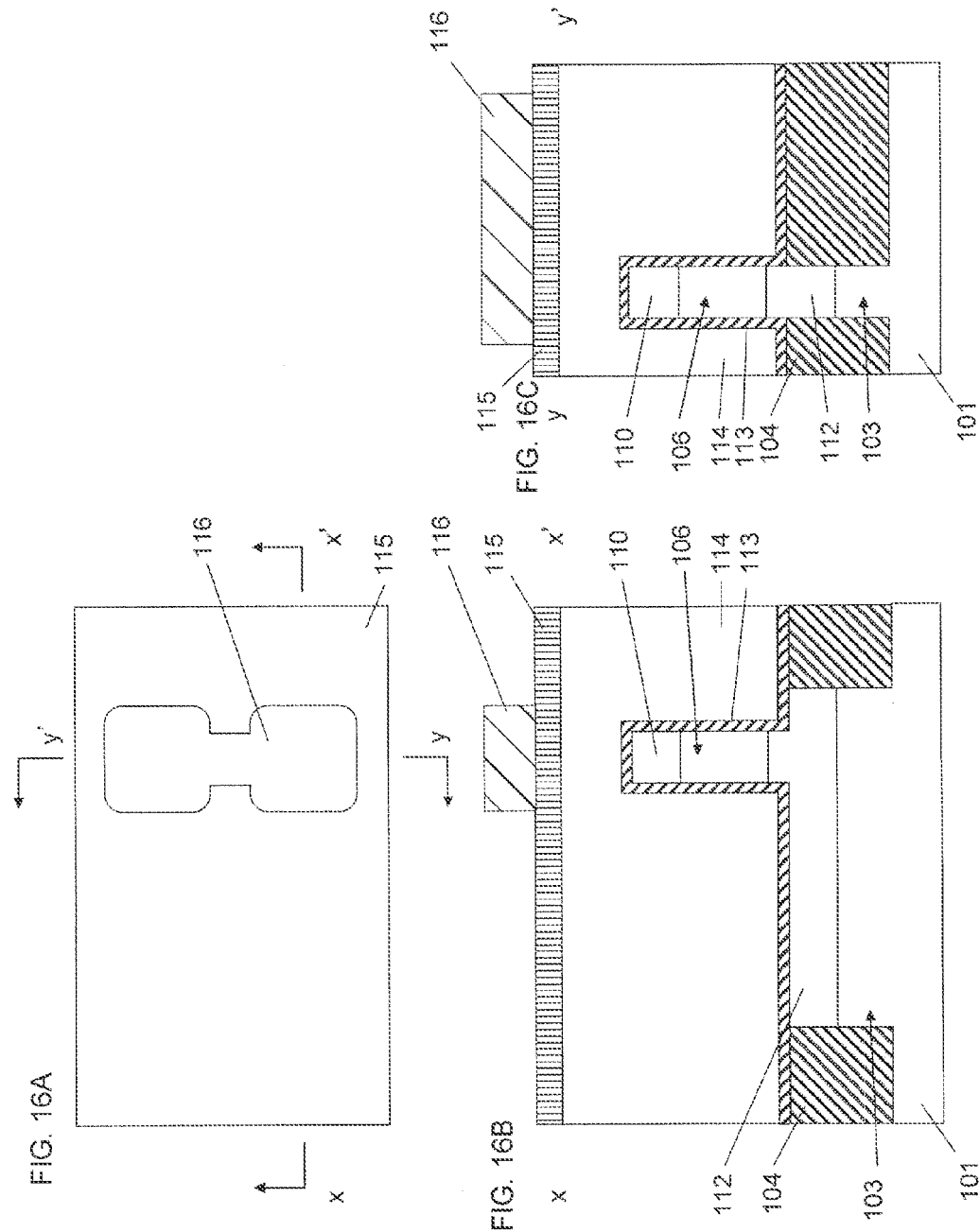

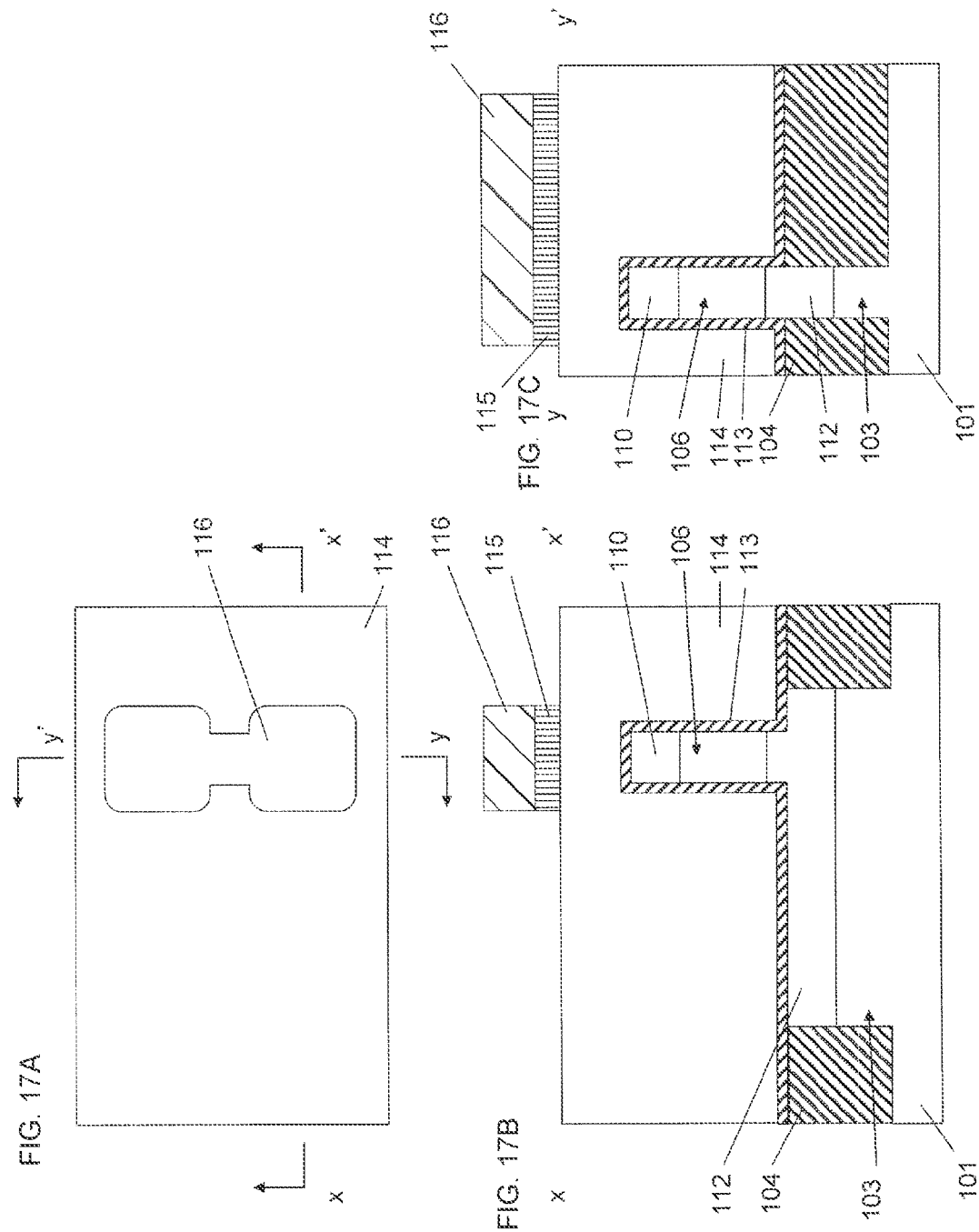

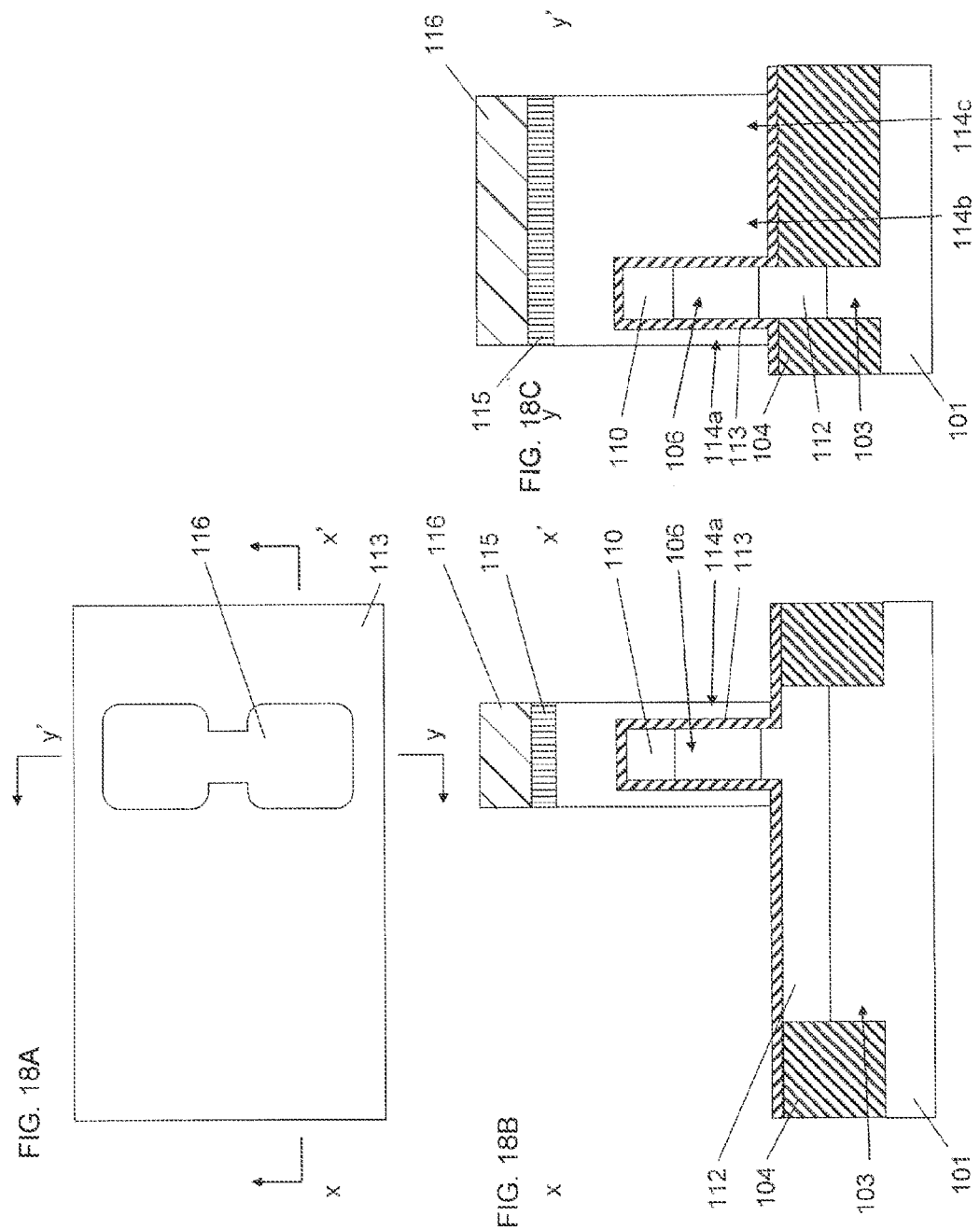

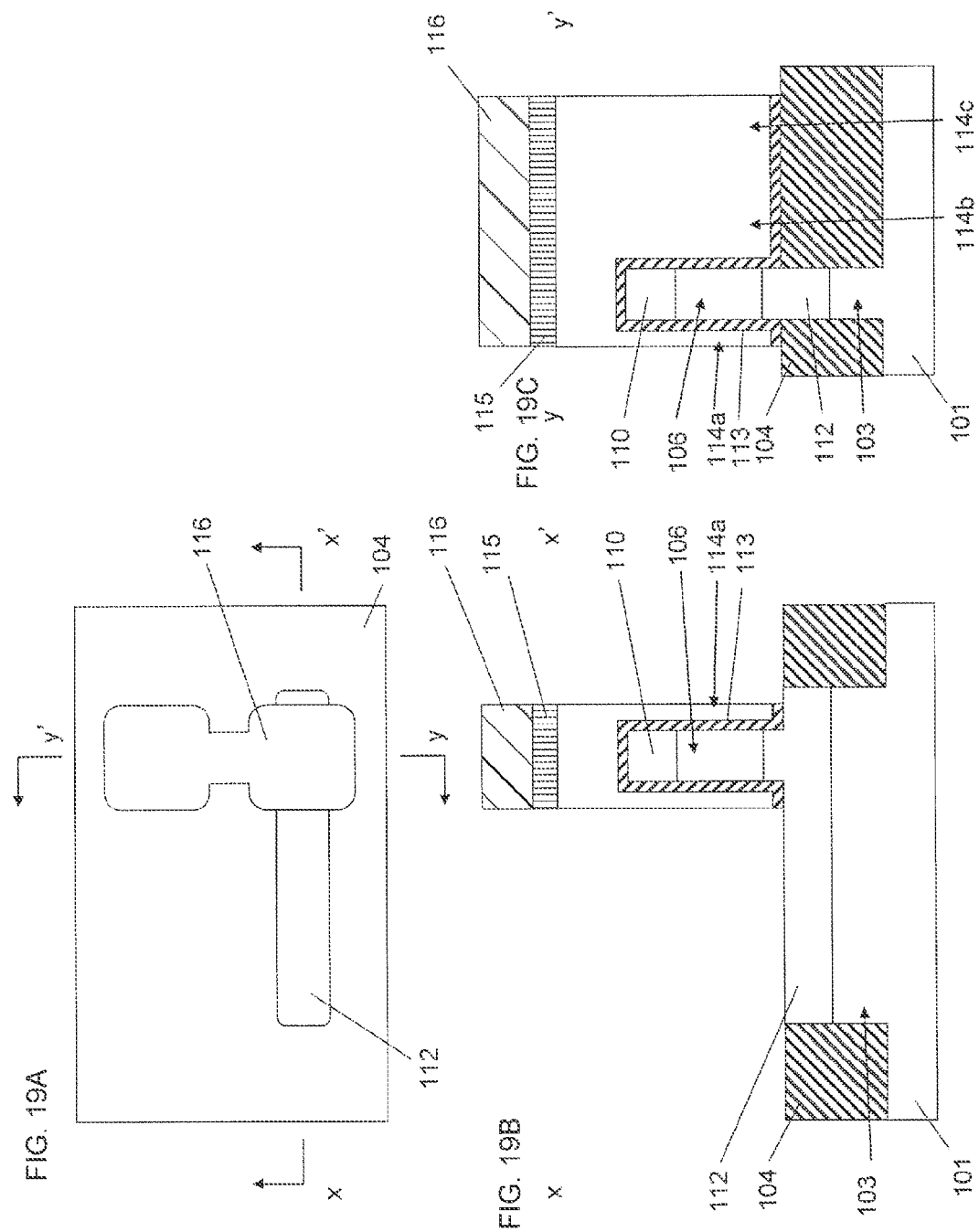

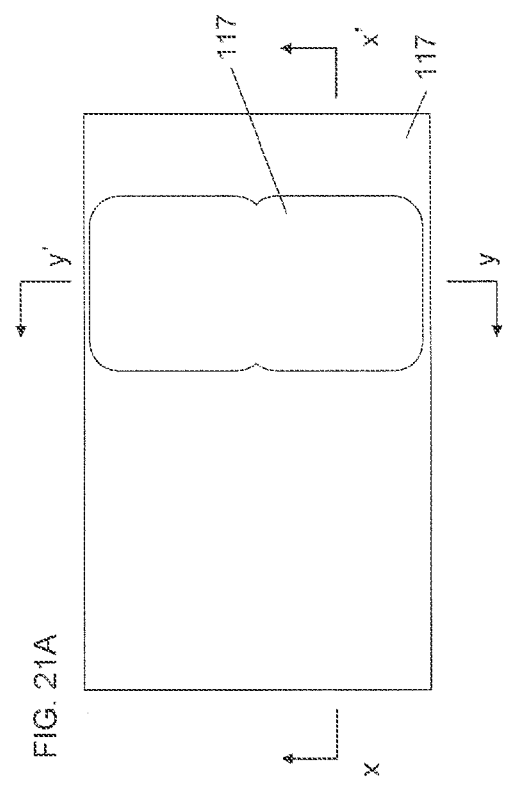
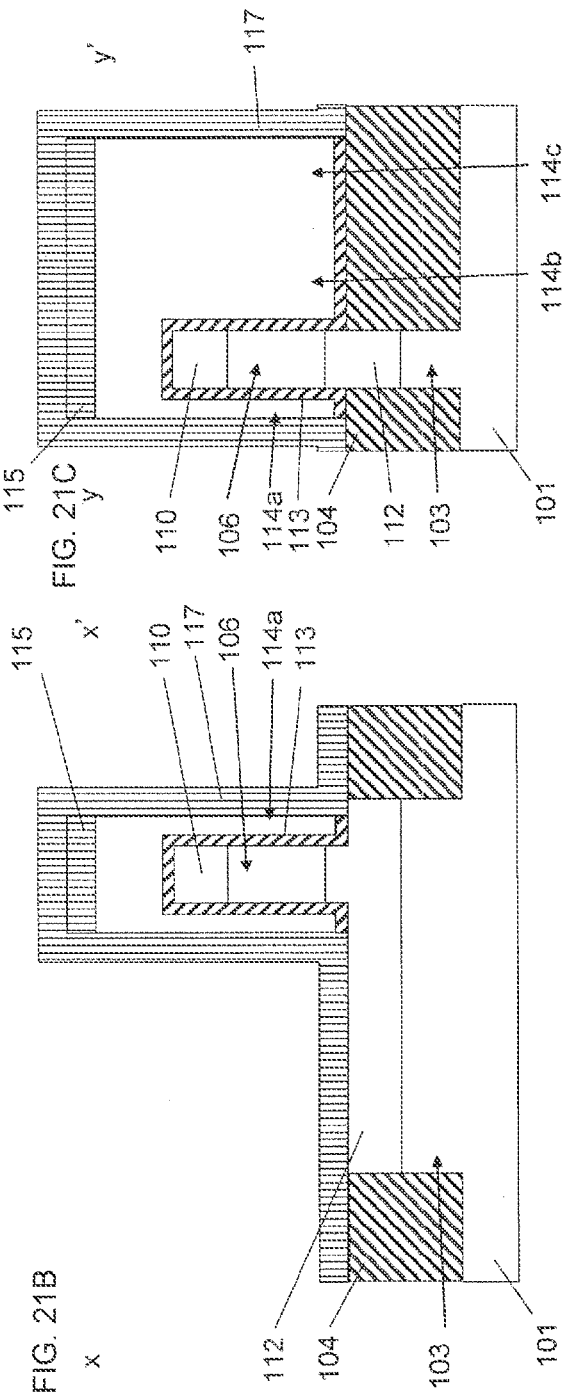
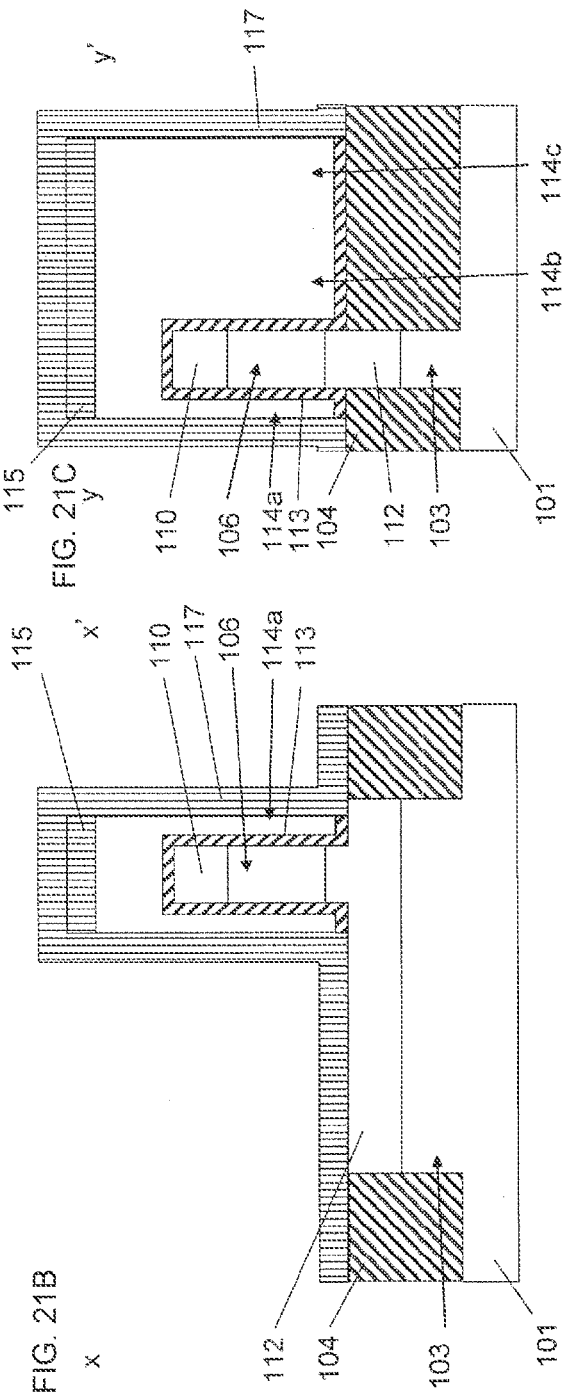

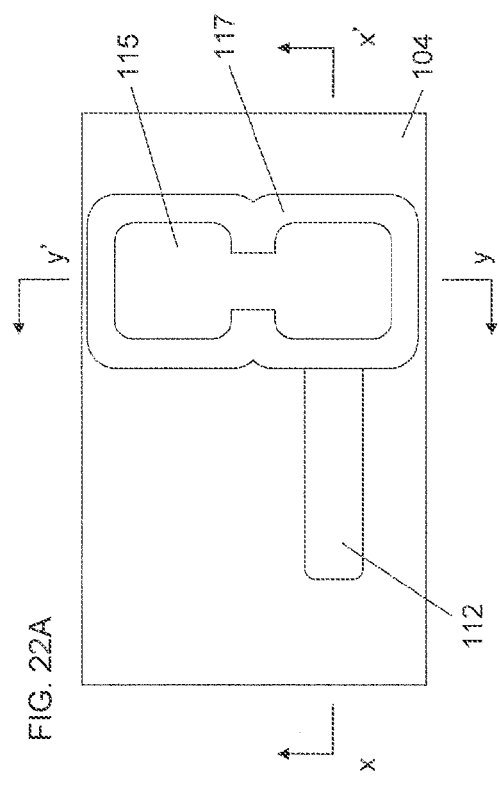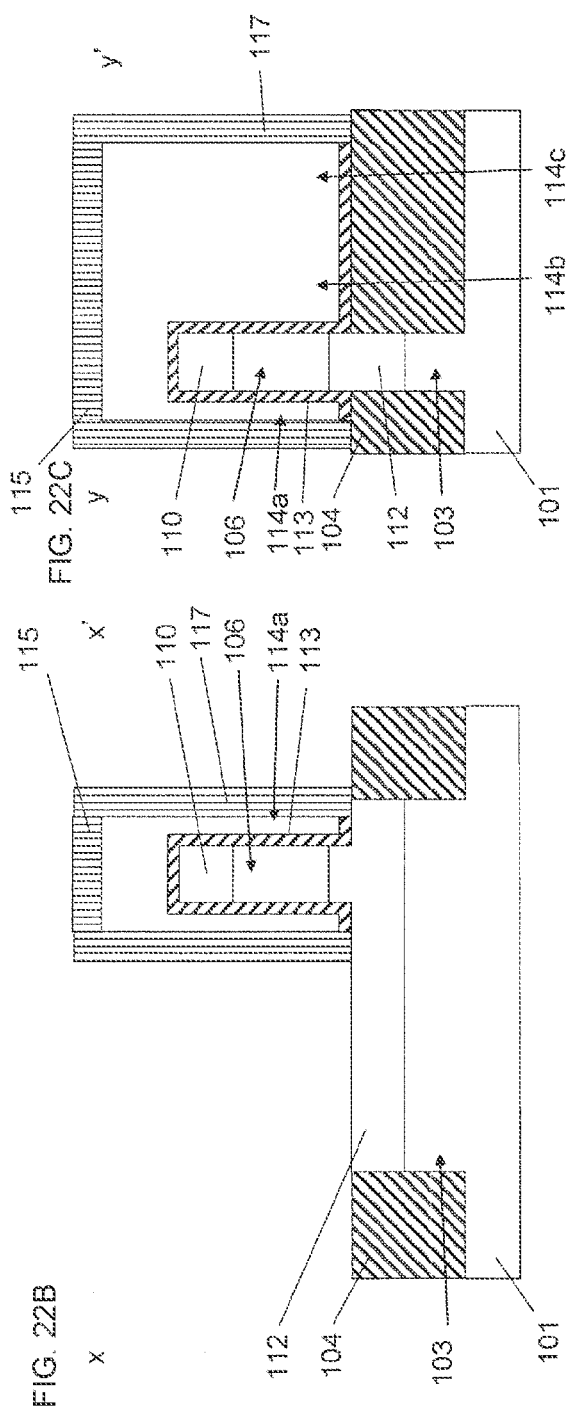

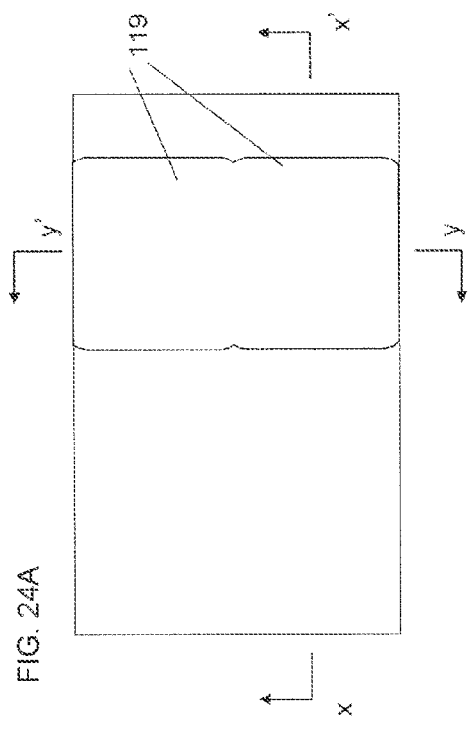
FIG. 24A
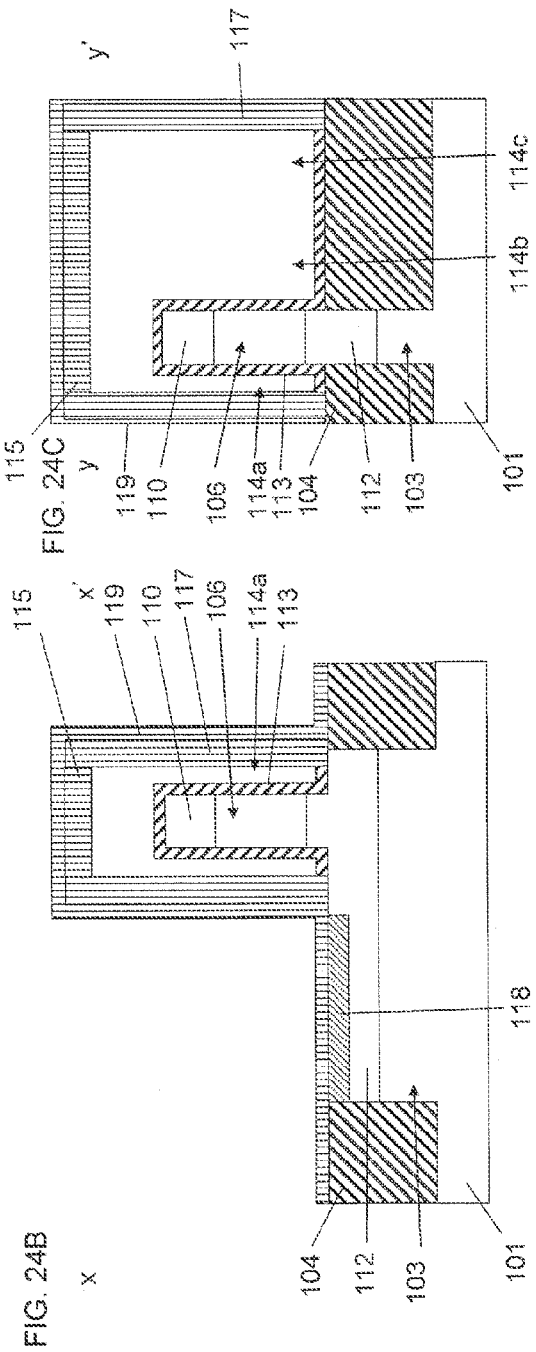
FIG. 24B
FIG. 24C

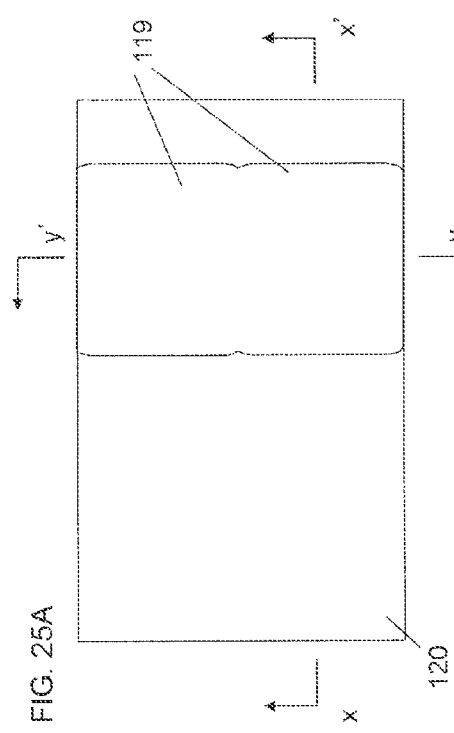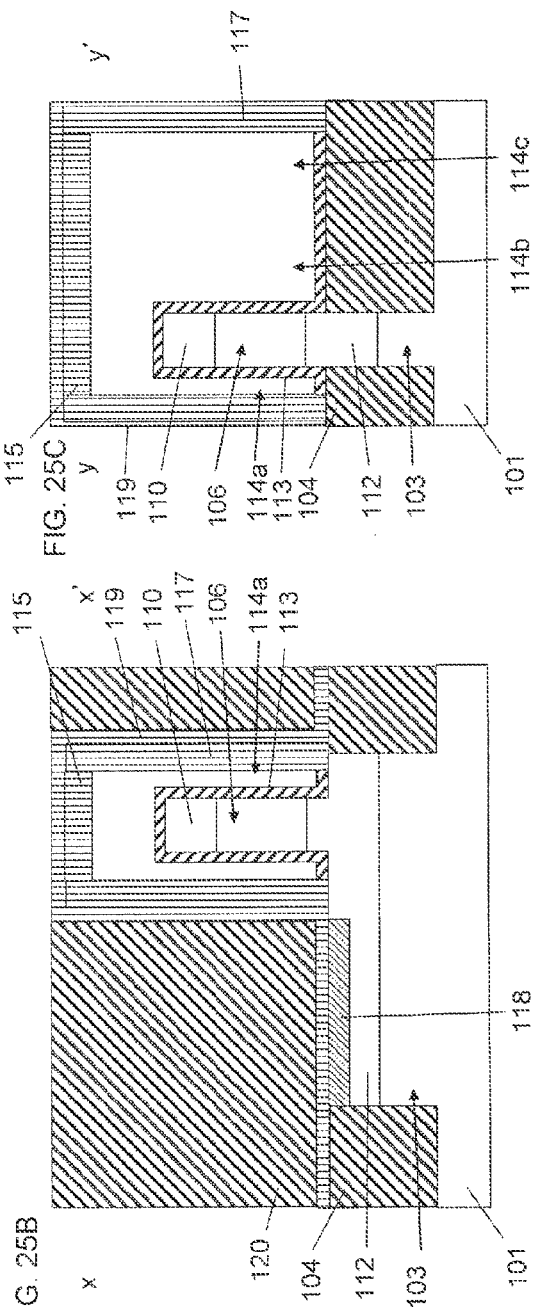
FIG. 25A
FIG. 25B
FIG. 25C

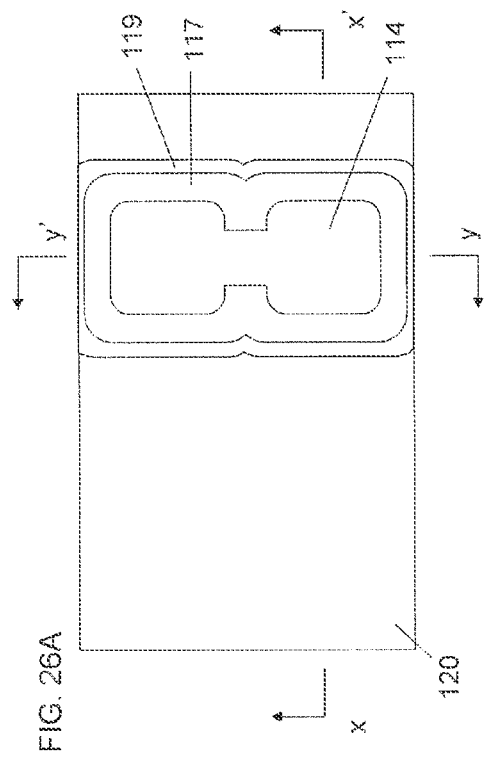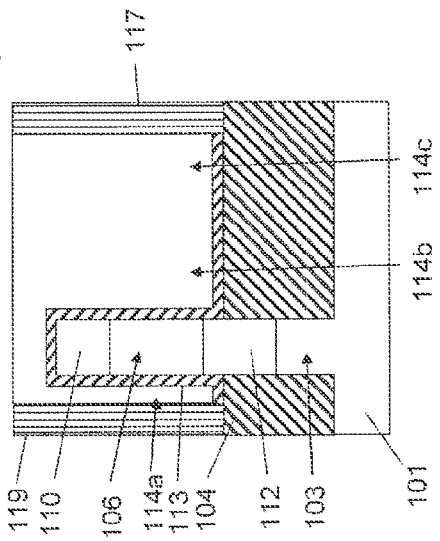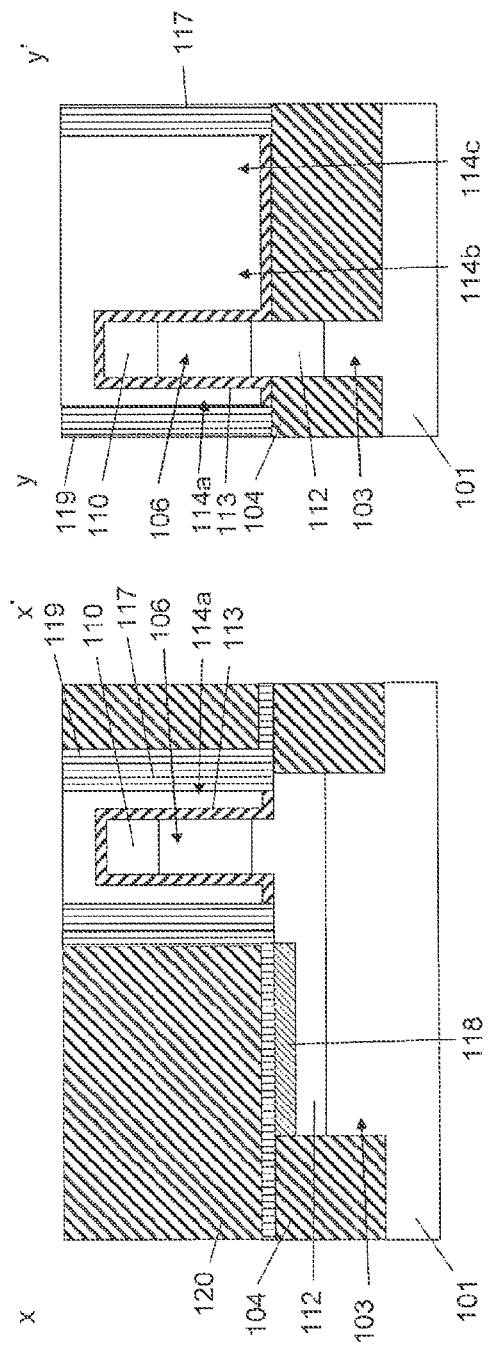

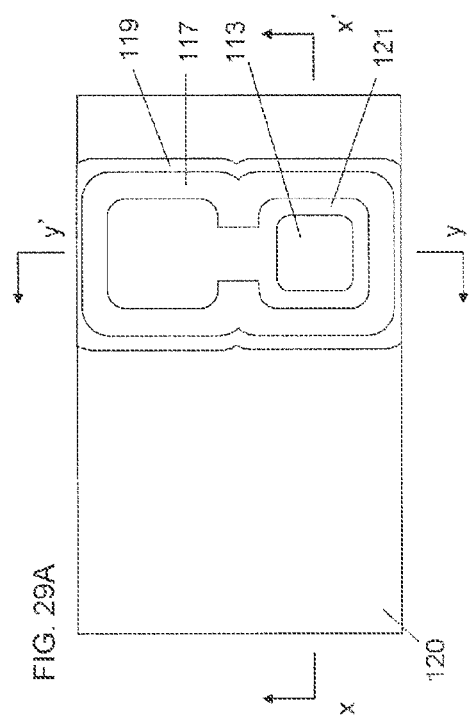
FIG. 29A
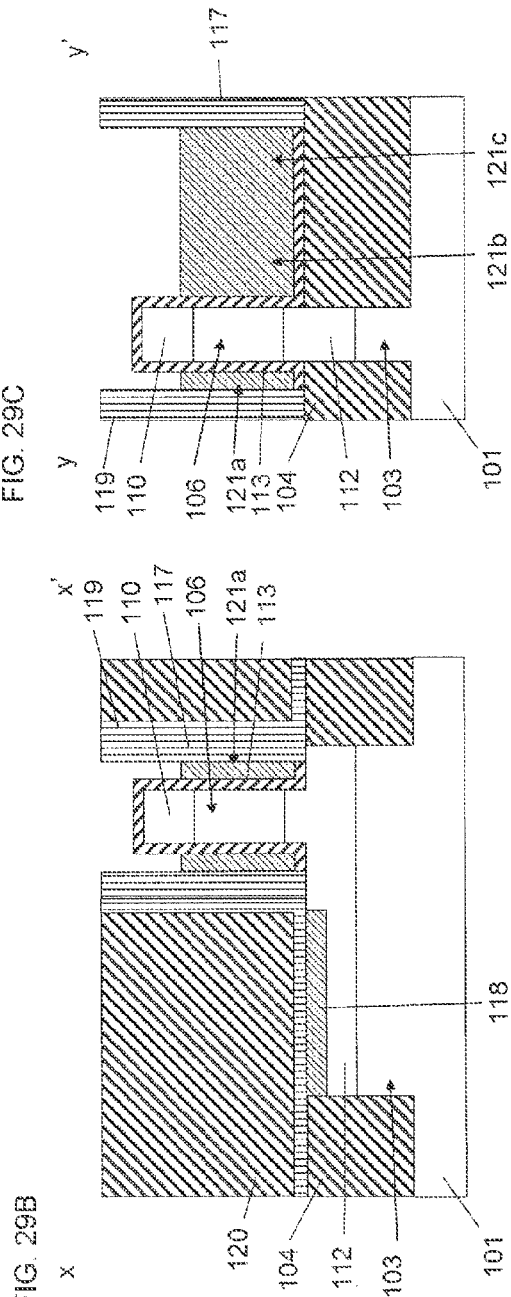
FIG. 29B
FIG. 29C

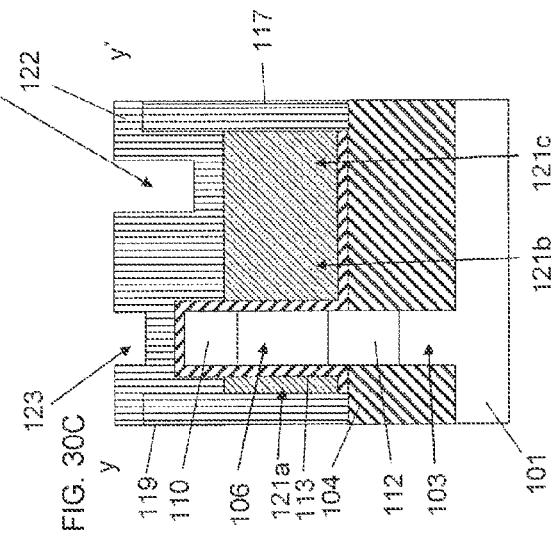
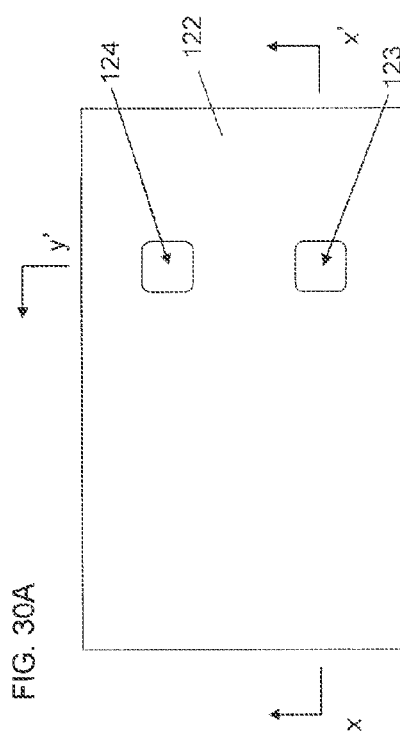
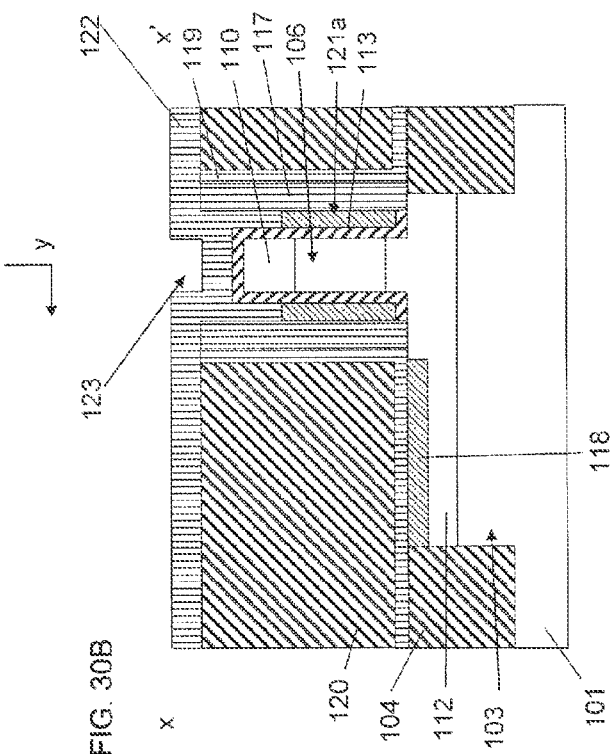

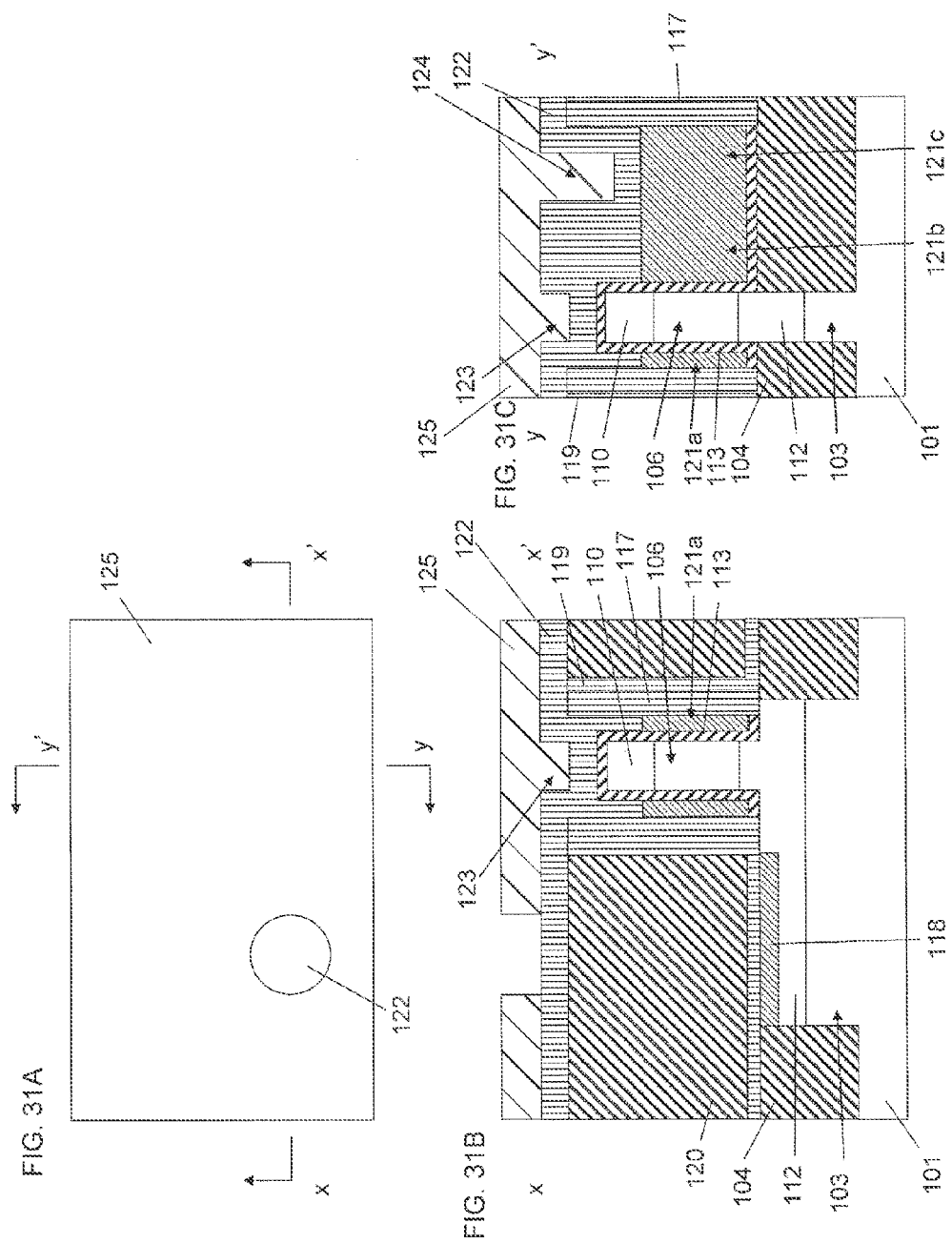

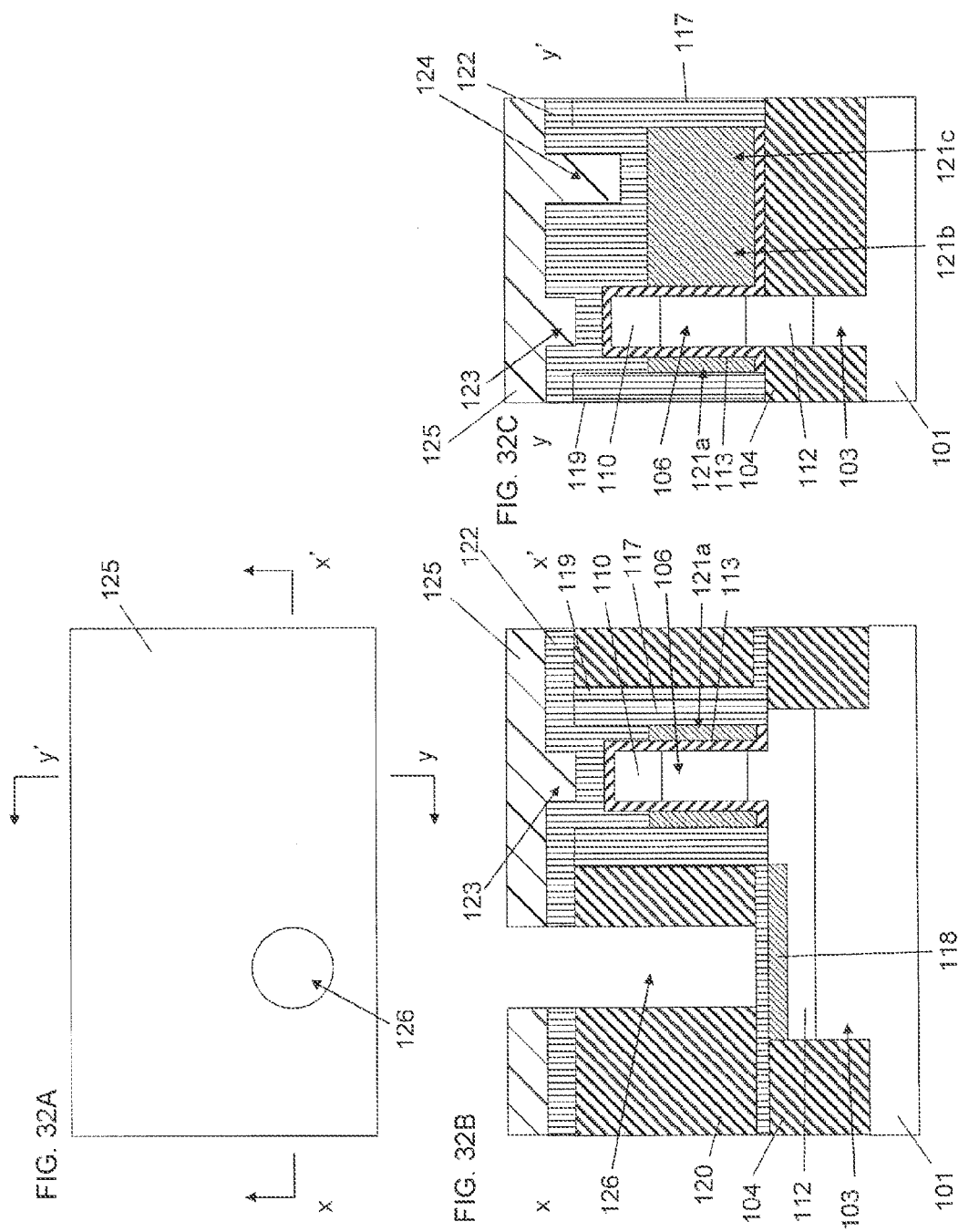

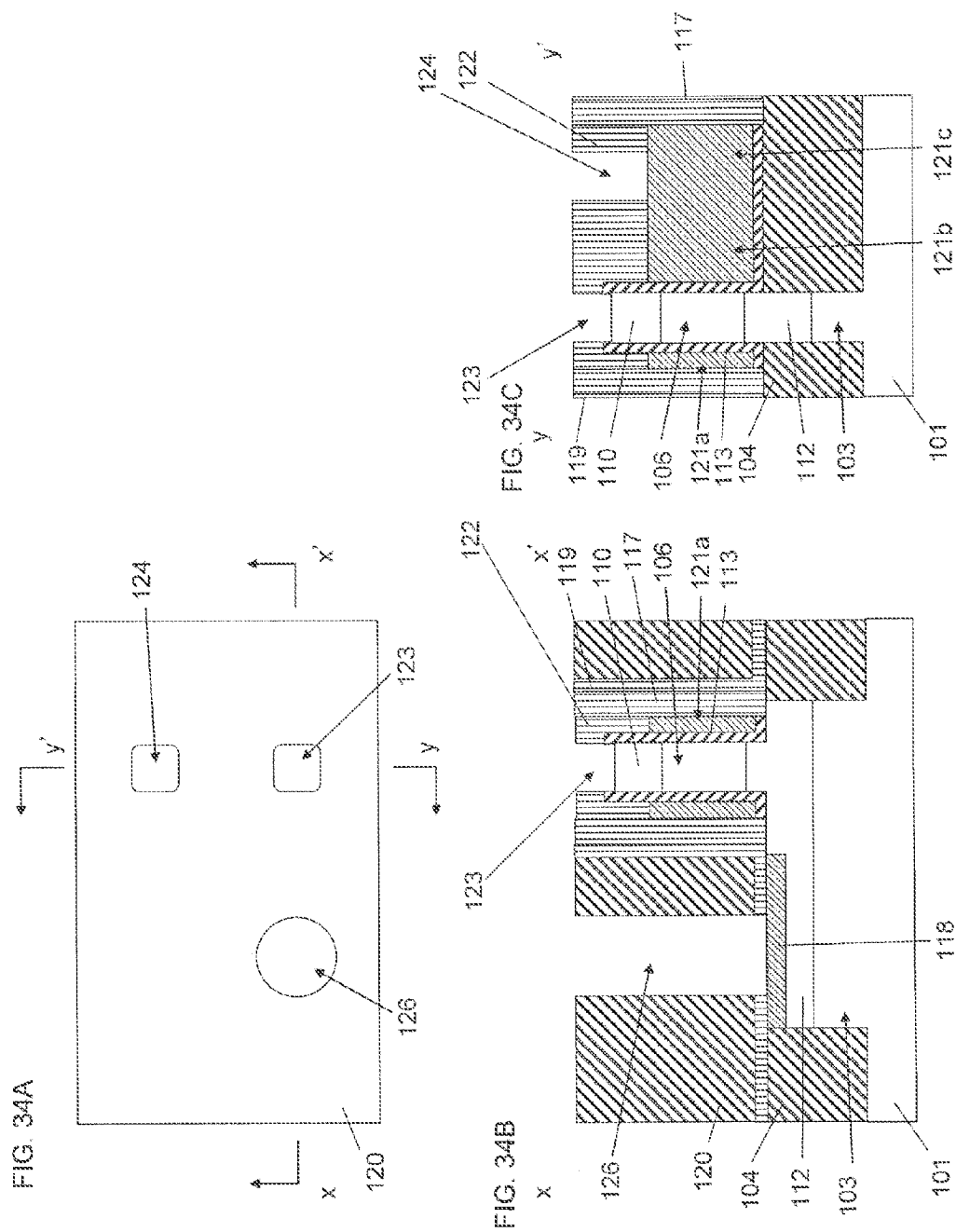

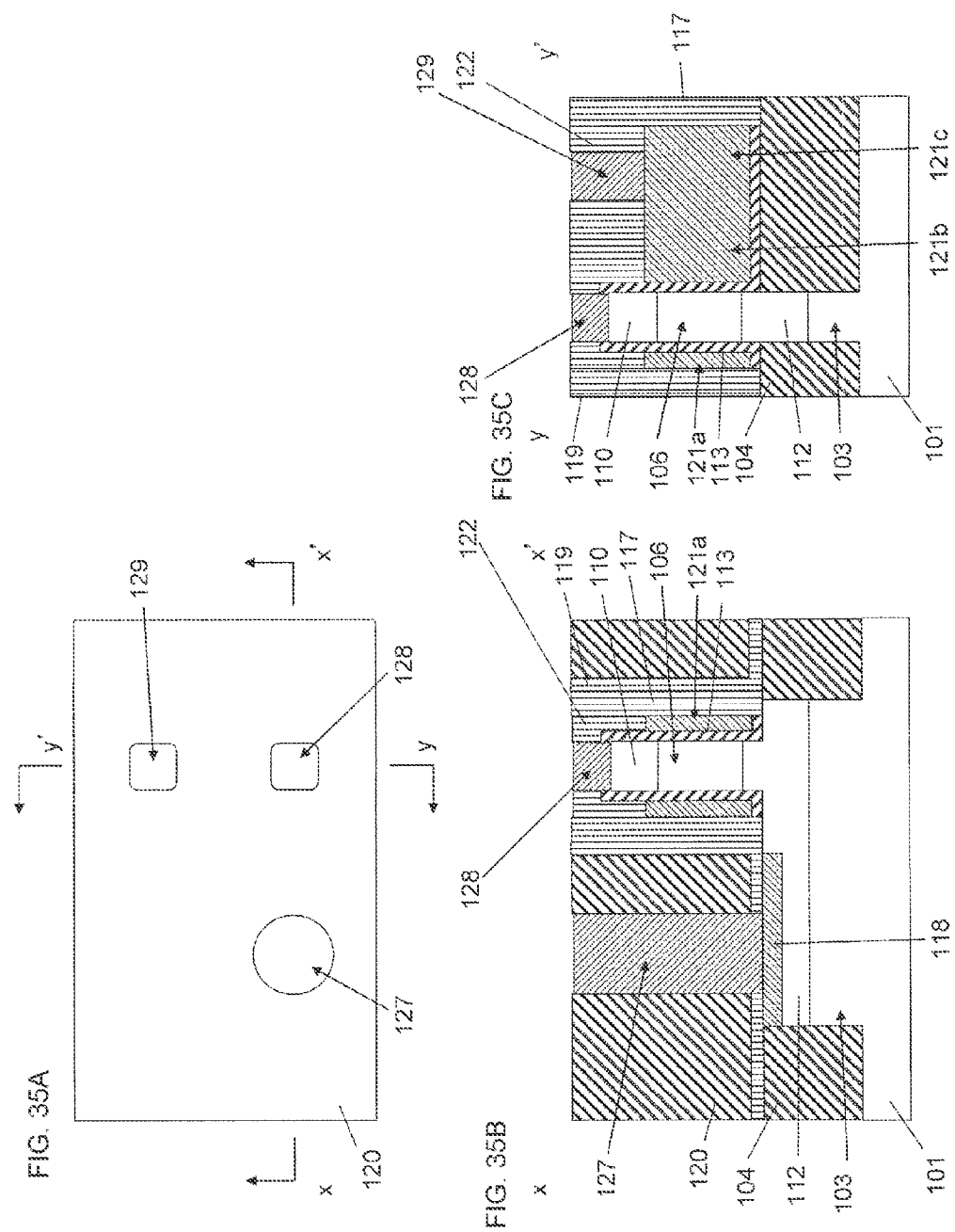

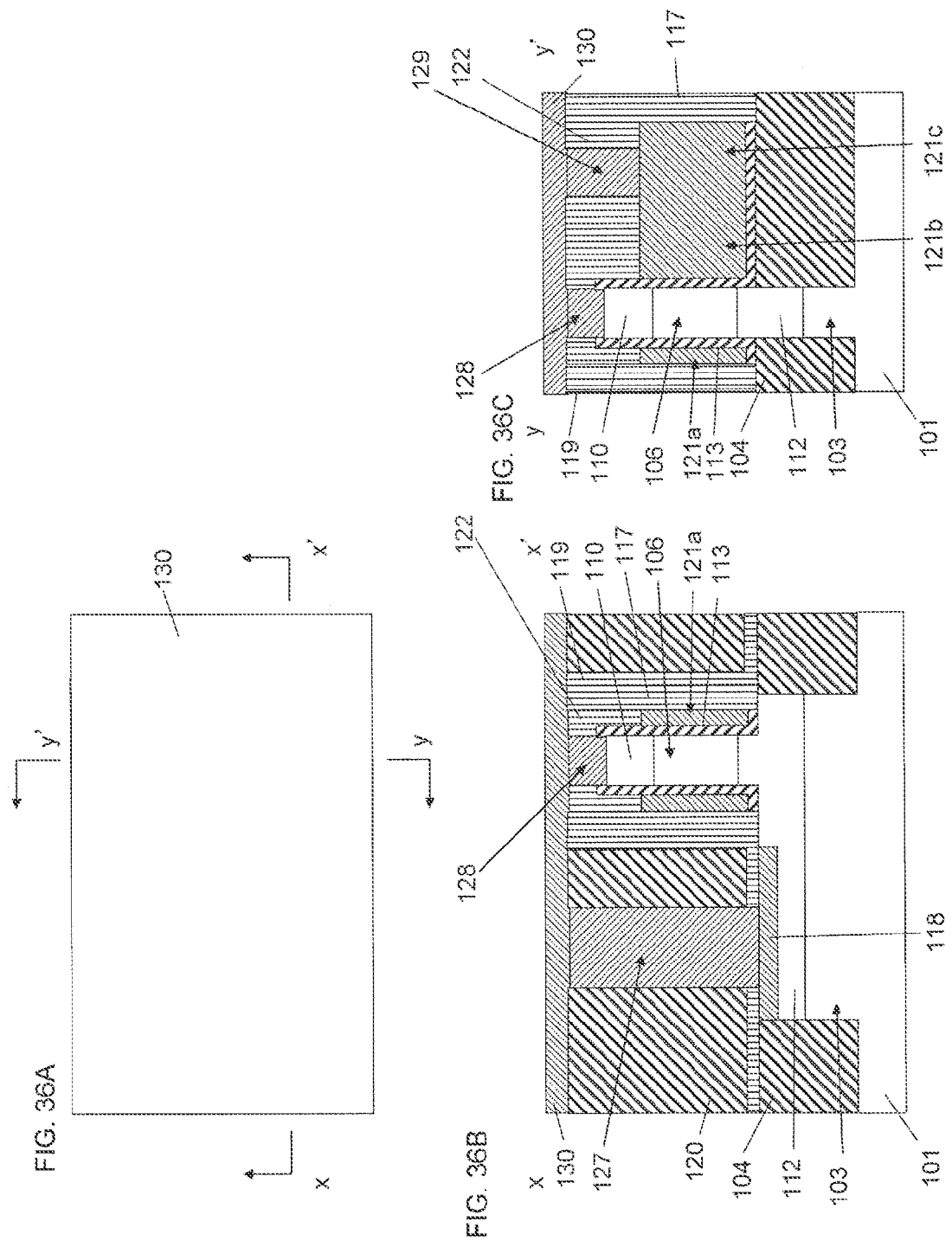

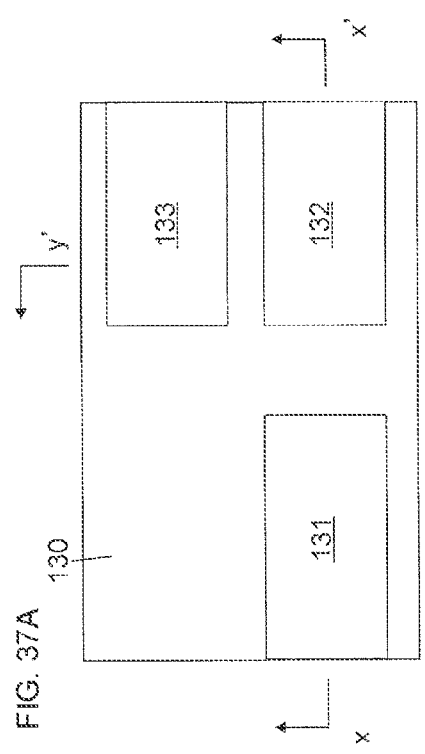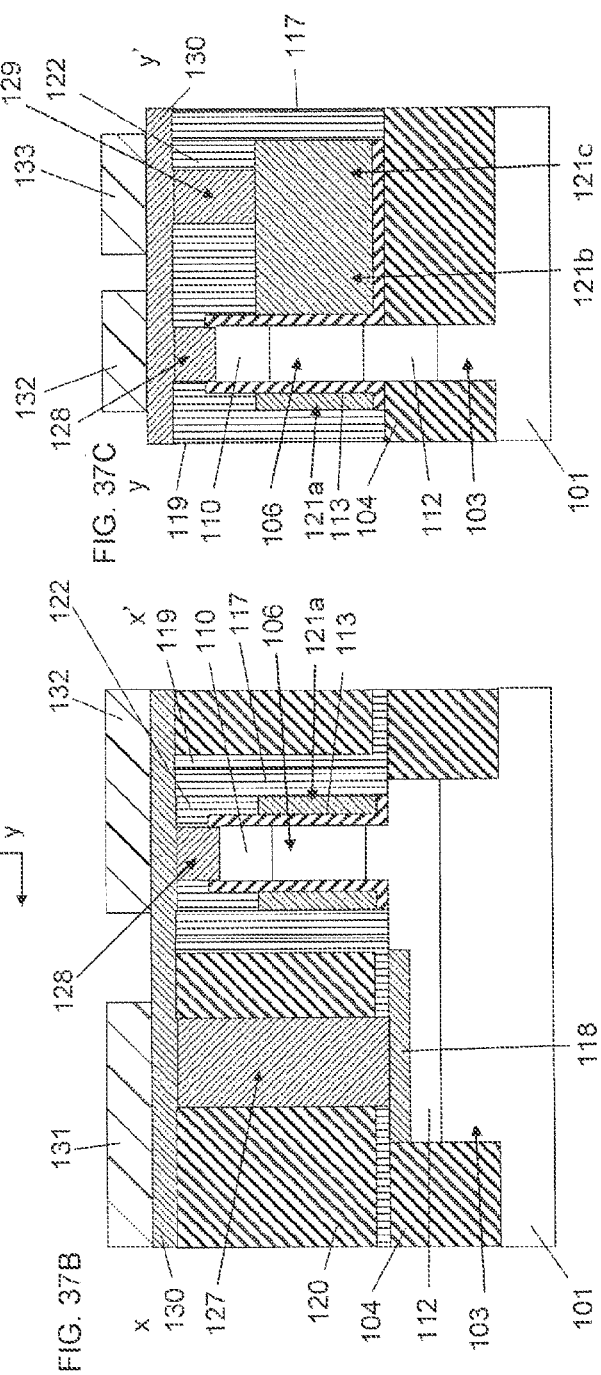

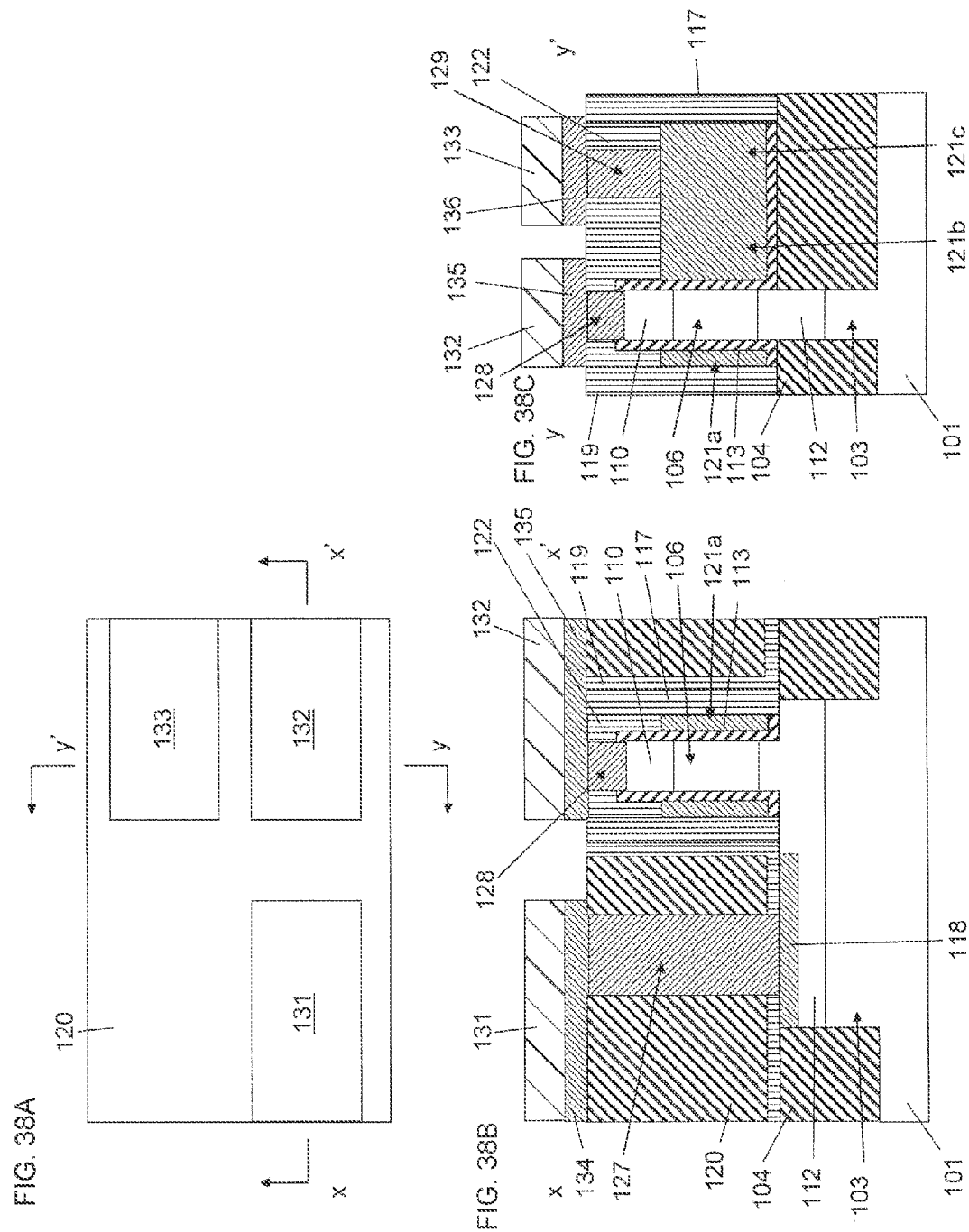

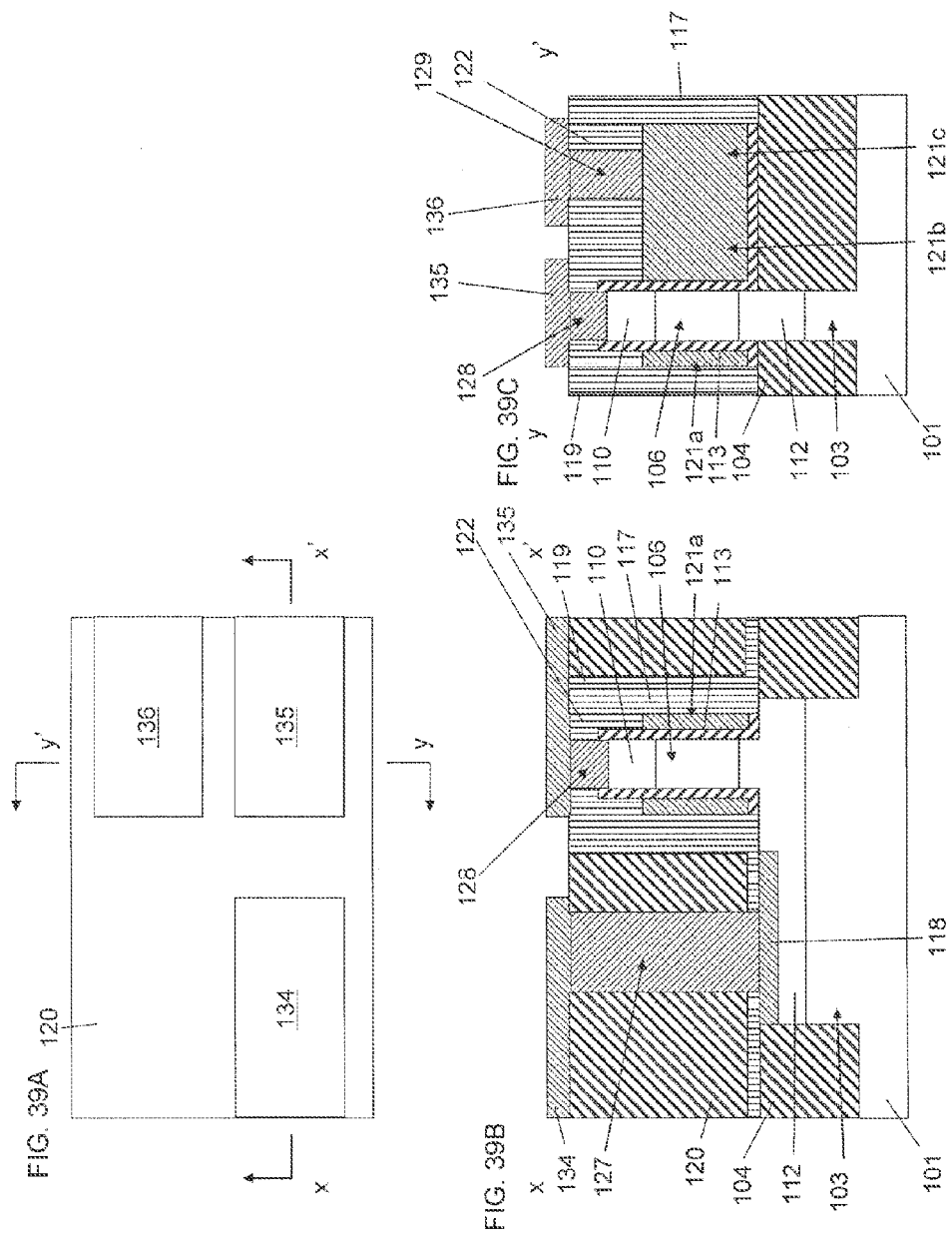

SEMICONDUCTOR DEVICE

RELATED APPLICATIONS

This application is a continuation application of U.S. patent application Ser. No. 14/607,783, filed Jan. 28, 2015, which is a continuation application of U.S. patent application Ser. No. 14/469,107, filed Aug. 26, 2014, now U.S. Pat. No. 9,029,923, which is a continuation of U.S. patent application Ser. No. 14/177,459, filed Feb. 11, 2014, now U.S. Pat. No. 8,823,066, which is a divisional patent application of U.S. patent application Ser. No. 13/891,655, filed May 10, 2013, now U.S. Pat. No. 8,697,511, which claims benefit pursuant to 35 U.S.C. §119(e) of U.S. Provisional Patent Application Ser. No. 61/648,817, filed May 18, 2012. The entire contents of which are hereby incorporated by reference.

BACKGROUND

1. Field of the Invention

The present invention relates to a semiconductor device.

2. Description of the Related Art

Semiconductor integrated circuits, in particular, integrated circuits that use MOS transistors, are becoming more and more highly integrated. As the circuits achieve higher integration, the size of MOS transistors used therein is reduced to a nanometer range. With smaller MOS transistors, it sometimes becomes difficult to suppress leak current and to decrease the area occupied by the circuit since a particular amount of current is required. Under these circumstances, a surrounding gate transistor (hereinafter referred to as SGT), which includes a source, a gate, and a drain arranged in perpendicular to a substrate, the gate surrounding a pillar-shaped semiconductor layer, has been proposed (for example, refer to Japanese Unexamined Patent Application Publication Nos. 2-71556, 2-188966, and 3-145761).

Using a metal in the gate electrode instead of polysilicon helps suppress depletion and decrease the resistance of the gate electrode. However, this requires a production process that always takes into account metal contamination caused by the metal gate in the steps subsequent to formation of the metal gate.

To produce existing MOS transistors, a metal-gate-last process in which a metal gate is formed after a high temperature process is put into practice so as to avoid incompatibility between the metal gate process and the high temperature process (for example, refer to A 45 nm Logic Technology with High-k+Metal Gate Transistors, Strained Silicon, 9 Cu Interconnect Layers, 193 nm Dry Patterning, and 100% Pb-free Packaging, IEDM2007 K. Mistry et. al, pp 247-250).

That is, a MOS transistor has been made by forming a gate with polysilicon, depositing an interlayer insulating film on the polysilicon, exposing the polysilicon gate by chemical mechanical polishing (CMP), etching the polysilicon gate, and depositing a metal. In order to avoid incompatibility between the metal gate process and the high temperature process, it is also necessary for producing a SGT to employ a metal-gate-last process with which a metal gate is formed after a high temperature process. Since the upper part of a pillar-shaped silicon layer of a SGT is located at a position higher than the gate, some adjustment must be made in employing the metal-gate-last process.

An existing MOS transistor uses a first insulating film in order to decrease the parasitic capacitance between the gate line and the substrate. For example, in making a FINFET (refer to High performance 22/20 nm FinFET CMOS devices with advanced high-K/metal gate scheme, IEDM2010, C C. Wu, et. al, 27.1.1-27.1.4, for example), a first insulating film is formed around one fin-shaped semiconductor layer and then etched back so as to expose the fin-shaped semiconductor layer and to decrease the parasitic capacitance between the gate line and the substrate. In making a SGT also, a first insulating film is needed to reduce the parasitic capacitance between the gate line and the substrate. Since a SGT includes not only a fin-shaped semiconductor layer but also a pillar-shaped semiconductor layer, some adjustment must be made in order to form a pillar-shaped semiconductor layer.

According to a known SGT manufacturing process, a contact hole for a pillar-shaped silicon layer is formed by etching through a mask and then contact holes for a gate line and a planar silicon layer are formed by etching through a mask (for example, refer to Japanese Unexamined Patent Application Publication No. 2011-258780). That is, conventionally, two masks have been used for forming contacts.

SUMMARY

The present invention has been made under the above-described circumstances. An object of the present invention is to provide a semiconductor device having reduced parasitic capacitance between a gate line and a substrate.

A method for producing a semiconductor device according to a first aspect of the present invention includes:
  a first step of forming a fin-shaped silicon layer on a silicon substrate, forming a first insulating film around the fin-shaped silicon layer, and forming a pillar-shaped silicon layer in an upper portion of the fin-shaped silicon layer so that a width of the pillar-shaped silicon layer is equal to a width of the fin-shaped silicon layer;
  the second step of implanting an impurity to an upper portion of the pillar-shaped silicon layer, an upper portion of the fin-shaped silicon layer, and a lower portion of the pillar-shaped silicon layer to form diffusion layers, the second step being performed after the first step;
  the third step of forming a gate insulating film, a polysilicon gate electrode, a polysilicon gate line, and a polysilicon gate pad so that the gate insulating film covers the periphery and an upper portion of the pillar-shaped silicon layer and the polysilicon gate electrode covers the gate insulating film, that, after the formation of the polysilicon gate electrode, the polysilicon gate line, and the polysilicon gate pad, an upper surface of the polysilicon is located at a position higher than the gate insulating film located on the diffusion layer in the upper portion of the pillar-shaped silicon layer, and that the width of the polysilicon gate electrode and the width of the polysilicon gate pad are larger than the width of the polysilicon gate line, the third step being performed after the second step;
  the fourth step of forming a silicide in an upper portion of the diffusion layer in the upper portion of the fin-shaped silicon layer, the fourth step being performed after the third step;
  the fifth step of depositing an interlayer insulating film, exposing the polysilicon gate electrode, polysilicon gate line, and the polysilicon gate pad, and etching the polysilicon gate electrode, polysilicon gate line, and the polysilicon gate pad, and depositing a metal layer so as to form a metal gate electrode, a metal gate line, and a metal gate pad, the metal gate line extending in a direction perpendicular to the fin-shaped silicon layer and being connected to the metal gate electrode, the fifth step being performed after the fourth step; and the sixth step of forming a contact directly connected to the diffusion layer in the upper portion of the pillar-shaped silicon layer, the sixth step being performed after the fifth step.

Preferably, a first resist for forming the fin-shaped silicon layer on the silicon substrate is formed, the silicon substrate is etched by using the first resist so as to form the fin-shape silicon layer, and then the first resist is removed.

Preferably, the first insulating film is deposited around the fin-shaped silicon layer and the first insulating film is etched back to expose the upper portion of the fin-shaped silicon layer.

Preferably, a second resist is formed so as to perpendicularly intersect the fin-shaped silicon layer, the fin-shaped silicon layer is etched by using the second resist, and the second resist is removed so that the part where the fin-shaped silicon layer and the second resist intersect forms the pillar-shaped silicon layer.

Preferably, a second oxide film is deposited from above a structure that includes the fin-shaped silicon layer formed on the silicon substrate, the first insulating film formed around the fin-shaped silicon layer, and the pillar-shaped silicon layer formed in the upper portion of the fin-shaped silicon layer, a first nitride film is formed on the second oxide film, and the first nitride film is etched so as to be left as a sidewall.

Preferably, an impurity is then implanted so as to form the diffusion layers in the upper portion of the pillar-shaped silicon layer and the upper portion of the fin-shaped silicon layer, the first nitride film and the second oxide film are removed, and then a heat-treatment is performed.

In a structure that includes the fin-shaped silicon layer formed on the silicon substrate, the first insulating film formed around the fin-shaped silicon layer, the pillar-shaped silicon layer formed in the upper portion of the fin-shaped silicon layer, the diffusion layer formed in the upper portion of the fin-shaped silicon layer and the lower portion of the pillar-shaped silicon layer, and the diffusion layer formed in the upper portion of the pillar-shaped silicon layer, preferably, a gate insulating film is formed, polysilicon is deposited and planarized, and an upper surface of the planarized polysilicon is located at a position higher than the gate insulating film on the diffusion layer in the upper portion of the pillar-shaped silicon layer; and preferably, a second nitride film is deposited, a third resist for forming the polysilicon gate electrode, the polysilicon gate line, and the polysilicon gate pad is formed, the second nitride film and the polysilicon are etched by using the third resist so as to form the polysilicon gate electrode, the polysilicon gate line, and the polysilicon gate pad, the gate insulating film is etched, and then the third resist is removed.

Preferably, a third nitride film is deposited and etched so as to be left as a sidewall, a metal layer is deposited, and a silicide is formed in an upper portion of the diffusion layer in the upper portion of the fin-shaped silicon layer.

Preferably, a fourth nitride film is deposited, an interlayer insulating film is deposited and planarized, the polysilicon gate electrode, the polysilicon gate line, and the polysilicon gate pad are exposed, the polysilicon gate electrode, the polysilicon gate line, and the polysilicon gate pad are removed, and spaces where the polysilicon gate electrode, the polysilicon gate line, and the polysilicon gate pad had existed are filled with a metal, and the metal is etched to expose the gate insulating film on the diffusion layer in the upper portion of the pillar-shaped silicon layer and to form the metal gate electrode, the metal gate line, and the metal gate pad.

Preferably, a fifth nitride film thicker than a half of the width of the polysilicon gate line and thinner than a half of the width of the polysilicon gate electrode and a half of the width of the polysilicon gate pad is deposited to form contact holes on the pillar-shaped silicon layer and the metal gate pad.

A semiconductor device according to a second aspect of the present invention includes a fin-shaped silicon layer on a silicon substrate;

a first insulating film around the fin-shaped silicon layer;

a pillar-shaped silicon layer on the fin-shaped silicon layer, a width of the pillar-shaped silicon layer being equal to a width of the fin-shaped silicon layer;

a first diffusion layer in an upper portion of the fin-shaped silicon layer and in a lower portion of the pillar-shaped silicon layer;

a second diffusion layer in an upper portion of the pillar-shaped silicon layer;

a gate insulating film around the pillar-shaped silicon layer;

a metal gate electrode around the gate insulating film;

a metal gate line extending in a direction perpendicular to the fin-shaped silicon layer and connected to the metal gate electrode;

a metal gate pad connected to the metal gate line;

a contact on the metal gate line; and a nitride film on an entire top surface of the metal gate electrode and the metal gate line except the bottom of the contact and a nitride film on the sidewall of the metal gate electrode and gate line;

wherein a vertical thickness of the nitride film on the entire top surface of the metal gate electrode and the metal gate line relative to the substrate is greater than a horizontal thickness of the nitride film on the sidewall of the metal gate electrode and gate line relative to the substrate, and wherein a height of the top surface of the metal gate electrode is equal to a height of the top surface of the metal gate line relative to the substrate.

According to the present invention, a method for producing a semiconductor device, the method being a gate-last process capable of reducing the parasitic capacitance between the gate line and the substrate and a semiconductor device produced through this method can be provided.

BRIEF DESCRIPTION OF THE DRAWINGS

FIG. 1A is a plan view of a semiconductor device according to the present invention, FIG. 1B is a cross-sectional view taken along line X-X' in FIG. 1A, and FIG. 1C is a cross-sectional view taken along line Y-Y' in FIG. 1A;

FIG. 2A is a plan view of a semiconductor device according to the present invention, FIG. 2B is a cross-sectional view taken along line X-X' in FIG. 2A, and FIG. 2C is a cross-sectional view taken along line Y-Y' in FIG. 2A;

FIG. 3A is a plan view of a semiconductor device according to the present invention, FIG. 3B is a cross-sectional view taken along line X-X' in FIG. 3A, and FIG. 3C is a cross-sectional view taken along line Y-Y' in FIG. 3A;

FIG. 4A is a plan view of a semiconductor device according to the present invention, FIG. 4B is a cross-sectional view taken along line X-X' in FIG. 4A, and FIG. 4C is a cross-sectional view taken along line Y-Y' in FIG. 4A;

FIG. 6A is a plan view of a semiconductor device according to the present invention, FIG. 6B is a cross-sectional view taken along line X-X' in FIG. 6A, and FIG. 6C is a cross-sectional view taken along line Y-Y' in FIG. 6A;

FIG. 7A is a plan view of a semiconductor device according to the present invention, FIG. 7B is a cross-sectional view taken along line X-X' in FIG. 7A, and FIG. 7C is a cross-sectional view taken along line Y-Y' in FIG. 7A;

FIG. 8A is a plan view of a semiconductor device according to the present invention, FIG. 8B is a cross-sectional view taken along line X-X' in FIG. 8A, and FIG. 8C is a cross-sectional view taken along line Y-Y' in FIG. 8A;

FIG. 9A is a plan view of a semiconductor device according to the present invention, FIG. 9B is a cross-sectional view taken along line X-X' in FIG. 9A, and FIG. 9C is a cross-sectional view taken along line Y-Y' in FIG. 9A;

FIG. 12A is a plan view of a semiconductor device according to the present invention, FIG. 12B is a cross-sectional view taken along line X-X' in FIG. 12A, and FIG. 12C is a cross-sectional view taken along line Y-Y' in FIG. 12A;

FIG. 13A is a plan view of a semiconductor device according to the present invention, FIG. 13B is a cross-sectional view taken along line X-X' in FIG. 13A, and FIG. 13C is a cross-sectional view taken along line Y-Y' in FIG. 13A;

FIG. 15A is a plan view of a semiconductor device according to the present invention, FIG. 15B is a cross-sectional view taken along line X-X' in FIG. 15A, and FIG. 15C is a cross-sectional view taken along line Y-Y' in FIG. 15A;

FIG. 16A is a plan view of a semiconductor device according to the present invention, FIG. 16B is a cross-sectional view taken along line X-X' in FIG. 16A, and FIG. 16C is a cross-sectional view taken along line Y-Y' in FIG. 16A;

FIG. 17A is a plan view of a semiconductor device according to the present invention, FIG. 17B is a cross-sectional view taken along line X-X' in FIG. 17A, and FIG. 17C is a cross-sectional view taken along line Y-Y' in FIG. 17A;

FIG. 18A is a plan view of a semiconductor device according to the present invention, FIG. 18B is a cross-sectional view taken along line X-X' in FIG. 18A, and FIG. 18C is a cross-sectional view taken along line Y-Y' in FIG. 18A;

FIG. 19A is a plan view of a semiconductor device according to the present invention, FIG. 19B is a cross-sectional view taken along line X-X' in FIG. 19A, and FIG. 19C is a cross-sectional view taken along line Y-Y' in FIG. 19A;

FIG. 21A is a plan view of a semiconductor device according to the present invention, FIG. 21B is a cross-sectional view taken along line X-X' in FIG. 21A, and FIG. 21C is a cross-sectional view taken along line Y-Y' in FIG. 21A;

FIG. 22A is a plan view of a semiconductor device according to the present invention, FIG. 22B is a cross-sectional view taken along line X-X' in FIG. 22A, and FIG. 22C is a cross-sectional view taken along line Y-Y' in FIG. 22A;

FIG. 24A is a plan view of a semiconductor device according to the present invention, FIG. 24B is a cross-sectional view taken along line X-X' in FIG. 24A, and FIG. 24C is a cross-sectional view taken along line Y-Y' in FIG. 24A;

FIG. 25A is a plan view of a semiconductor device according to the present invention, FIG. 25B is a cross-sectional view taken along line X-X' in FIG. 25A, and FIG. 25C is a cross-sectional view taken along line Y-Y' in FIG. 25A;

FIG. 26A is a plan view of a semiconductor device according to the present invention, FIG. 26B is a cross-sectional view taken along line X-X' in FIG. 26A, and FIG. 26C is a cross-sectional view taken along line Y-Y' in FIG. 26A;

FIG. 29A is a plan view of a semiconductor device according to the present invention, FIG. 29B is a cross-sectional view taken along line X-X' in FIG. 29A, and FIG. 29C is a cross-sectional view taken along line Y-Y' in FIG. 29A;

FIG. 30A is a plan view of a semiconductor device according to the present invention, FIG. 30B is a cross-sectional view taken along line X-X' in FIG. 30A, and FIG. 30C is a cross-sectional view taken along line Y-Y' in FIG. 30A;

FIG. 31A is a plan view of a semiconductor device according to the present invention, FIG. 31B is a cross-sectional view taken along line X-X' in FIG. 31A, and FIG. 31C is a cross-sectional view taken along line Y-Y' in FIG. 31A;

FIG. 32A is a plan view of a semiconductor device according to the present invention, FIG. 32B is a cross-sectional view taken along line X-X' in FIG. 32A, and FIG. 32C is a cross-sectional view taken along line Y-Y' in FIG. 32A;

FIG. 34A is a plan view of a semiconductor device according to the present invention, FIG. 34B is a cross-sectional view taken along line X-X' in FIG. 34A, and FIG. 34C is a cross-sectional view taken along line Y-Y' in FIG. 34A;

FIG. 35A is a plan view of a semiconductor device according to the present invention, FIG. 35B is a cross-sectional view taken along line X-X' in FIG. 35A, and FIG. 35C is a cross-sectional view taken along line Y-Y' in FIG. 35A;

FIG. 36A is a plan view of a semiconductor device according to the present invention, FIG. 36B is a cross-sectional view taken along line X-X' in FIG. 36A, and FIG. 36C is a cross-sectional view taken along line Y-Y' in FIG. 36A;

FIG. 37A is a plan view of a semiconductor device according to the present invention, FIG. 37B is a cross-sectional view taken along line X-X' in FIG. 37A, and FIG. 37C is a cross-sectional view taken along line Y-Y' in FIG. 37A;

FIG. 38A is a plan view of a semiconductor device according to the present invention, FIG. 38B is a cross-sectional view taken along line X-X' in FIG. 38A, and FIG. 38C is a cross-sectional view taken along line Y-Y' in FIG. 38A; and FIG. 39A is a plan view of a semiconductor device according to the present invention, FIG. 39B is a cross-sectional view taken along line X-X' in FIG. 39A, and FIG. 39C is a cross-sectional view taken along line Y-Y' in FIG. 39A.

DETAILED DESCRIPTION OF THE PREFERRED EMBODIMENTS

A method for producing a semiconductor device according to an embodiment of the present invention and a semiconductor device obtained by the method will now be described with reference to drawings.

A production method that includes forming a fin-shaped silicon layer on a silicon substrate, forming a first insulating film around the fin-shaped silicon layer, and forming a pillar-shaped silicon layer in an upper portion of the fin-shaped silicon layer is described below.

First, as shown in FIGS. 2A-2C, a first resist 102 for forming a fin-shaped silicon layer is formed on a silicon substrate 101.

Next, as shown in FIGS. 3A-3C, the silicon substrate 101 is etched to form a fin-shaped silicon layer 103. Although a fin-shaped silicon layer is formed by using a resist as a mask here, a hard mask such as an oxide film or a nitride film may be used instead of the resist.

Next, as shown in FIGS. 4A-4C, the first resist 102 is removed.

Figure 5A:
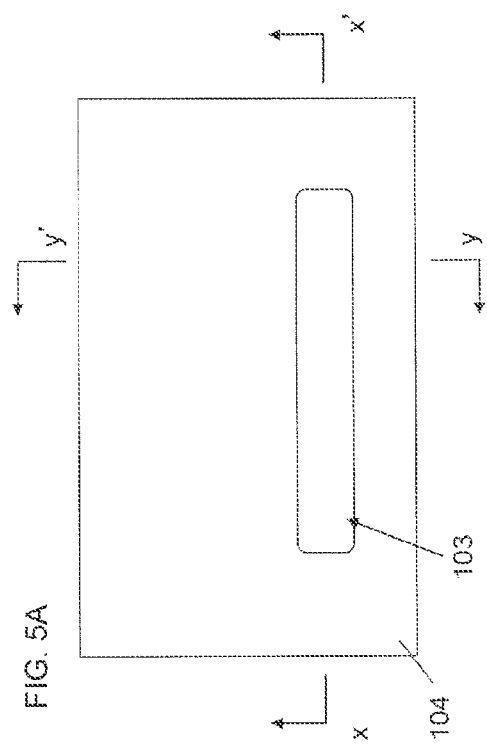
FIG. 5A is a plan view of a semiconductor device according to the present invention.
Figure 5C:
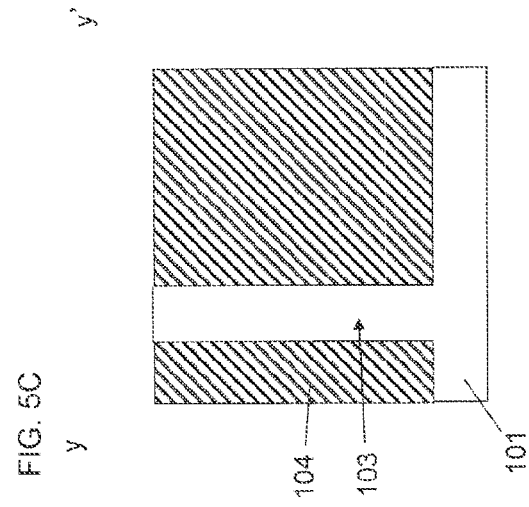
FIG. 5C is a cross-sectional view taken along line Y-Y' in FIG. 5A.
Figure 5B:
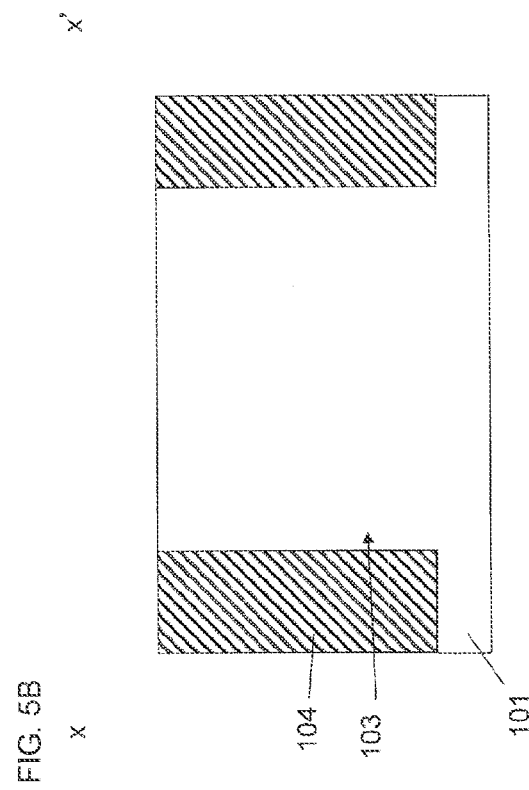
FIG. 5B is a cross-sectional view taken along line X-X' in FIG. 5A.

Then, as shown in FIGS. 5A-5C, a first insulating film 104 composed of an oxide is formed around the fin-shaped silicon layer 103 by deposition. The first insulating film may be an oxide film formed by a high-density plasma process or an oxide film formed by a low-pressure chemical vapor deposition process instead of one made by such a deposition method.

As shown in FIGS. 6A-6C, the first insulating film 104 is etched back to expose an upper portion of the fin-shaped silicon layer 103. The process up to here is the same as the process of making a fin-shaped silicon layer in PTL 2.

As shown in FIGS. 7A-7C, a second resist 105 is formed to perpendicularly intersect the fin-shaped silicon layer 103. The part where the fin-shaped silicon layer 103 and the second resist 105 intersect forms a pillar-shaped silicon layer. Since a line-shaped resist can be used as such, the possibility of the break of the resist after formation of a pattern is low and the process becomes stable.

Then, as shown in FIGS. 8A-8C, the fin-shaped silicon layer 103 is shaped by etching. As a result, the part where the fin-shaped silicon layer 103 and the second resist 105 intersect forms a pillar-shaped silicon layer 106. Accordingly, the width of the pillar-shaped silicon layer 106 is equal to the width of the fin-shaped silicon layer 103. As a result, a structure in which the pillar-shaped silicon layer 106 is formed in the upper portion of the fin-shaped silicon layer 103 and the first insulating film 104 is formed around the fin-shaped silicon layer 103 is formed.

As shown in FIGS. 9A-9C, the second resist 105 is removed.

A method for forming diffusion layers by implanting an impurity into an upper portion of the pillar-shaped silicon layer, an upper portion of the fin-shaped silicon layer, and a lower portion of the pillar-shaped silicon layer is described below.

Figure 10A:
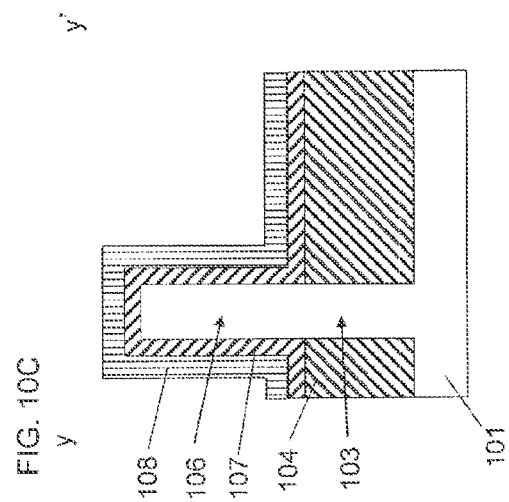
FIG. 10A is a plan view of a semiconductor device according to the present invention.
Figure 10B:
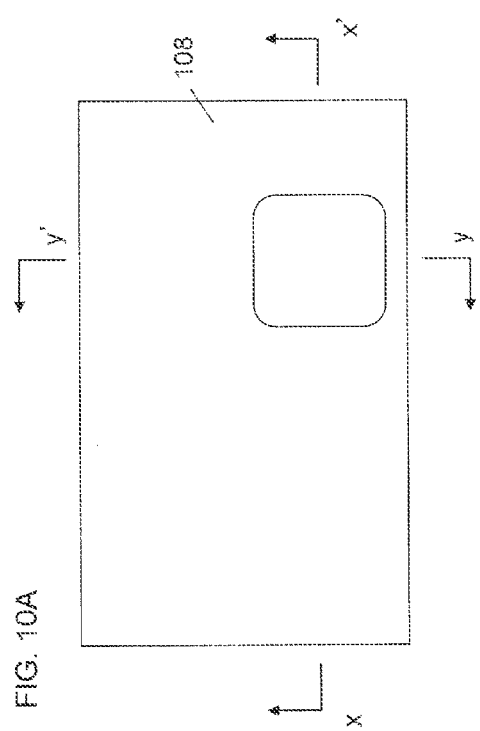
FIG. 10B is a cross-sectional view taken along line X-X' in FIG. 10A.
Figure 10C:
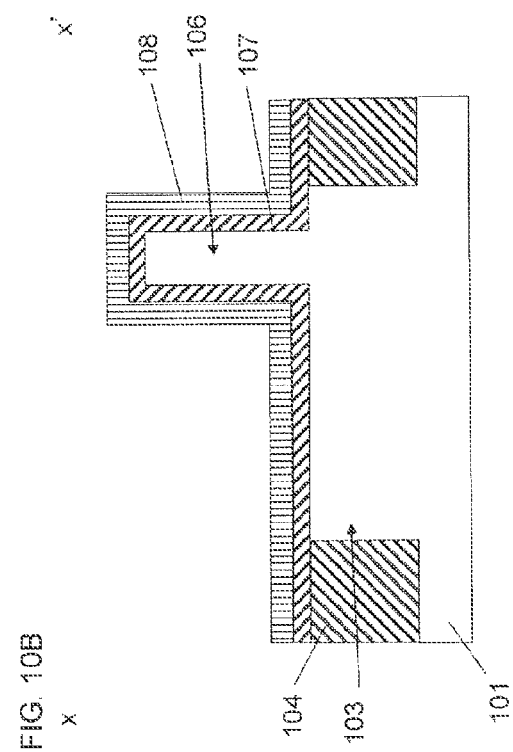
FIG. 10C is a cross-sectional view taken along line Y-Y' in FIG. 10A.

That is, as shown in FIGS. 10A-10C, a second oxide film 107 is formed by deposition and a first nitride film 108 is formed. In order to prevent the impurity from being implanted into the sidewall of the pillar-shaped silicon layer, the first nitride film 108 need be formed only on the sidewall of the pillar-shaped silicon layer so as to have a sidewall shape. Since the upper part of the pillar-shaped silicon layer will be covered with a gate insulating film and a polysilicon gate electrode in the subsequent steps, it is desirable to form a diffusion layer in the upper portion of the pillar-shaped silicon layer before the pillar-shaped silicon layer is covered as such.

Figure 11C:
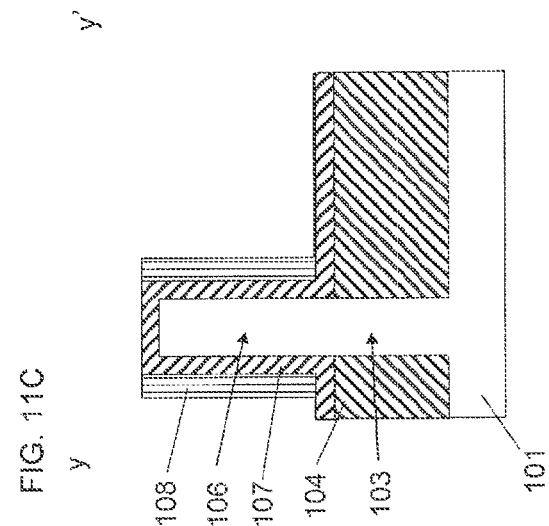
FIG. 11C is a cross-sectional view taken along line Y-Y' in FIG. 11A.
Figure 11A:
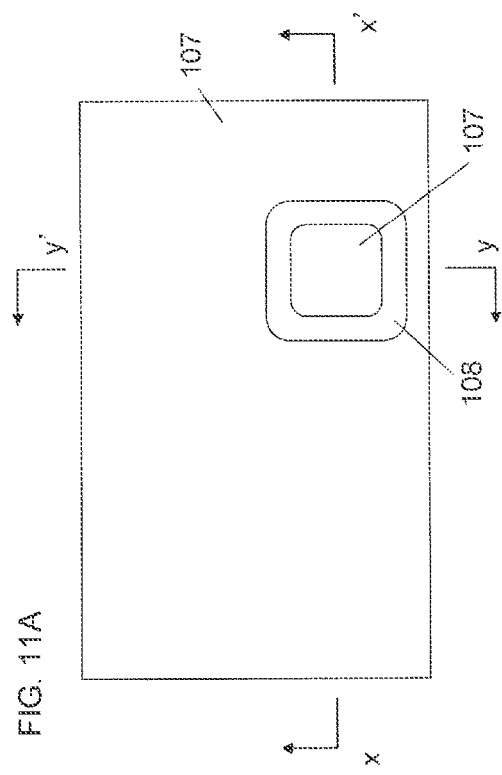
FIG. 11A is a plan view of a semiconductor device according to the present invention.
Figure 11B:
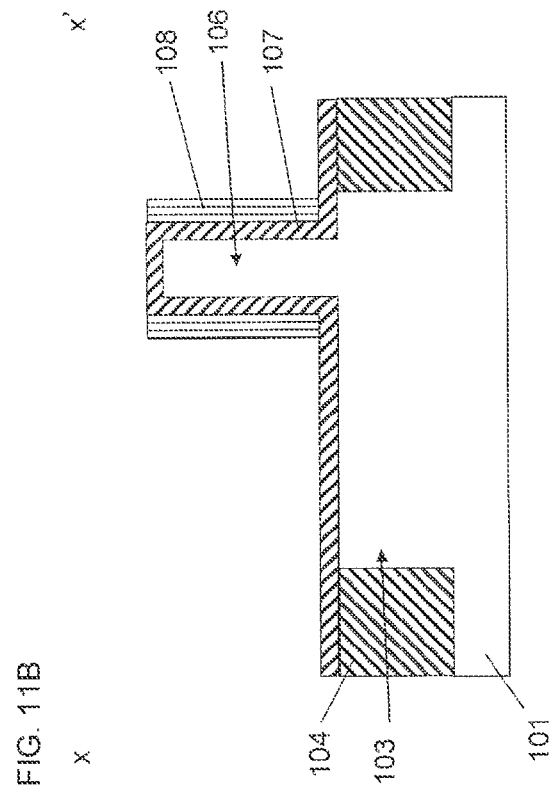
FIG. 11B is a cross-sectional view taken along line X-X' in FIG. 11A.

Then, as shown in FIGS. 11A-11C, the first nitride film 108 is etched so as to be left as a sidewall.

Next, as shown in FIGS. 12A-12C, an impurity such as arsenic, phosphorus, or boron is implanted to form a diffusion layer 110 in the upper portion of the pillar-shaped silicon layer and diffusion layers 109 and 111 in the upper portion of the fin-shaped silicon layer 103.

Then, as shown in FIGS. 13A-13C, the first nitride film 108 and the second oxide film 107 are removed.

Figure 14A:
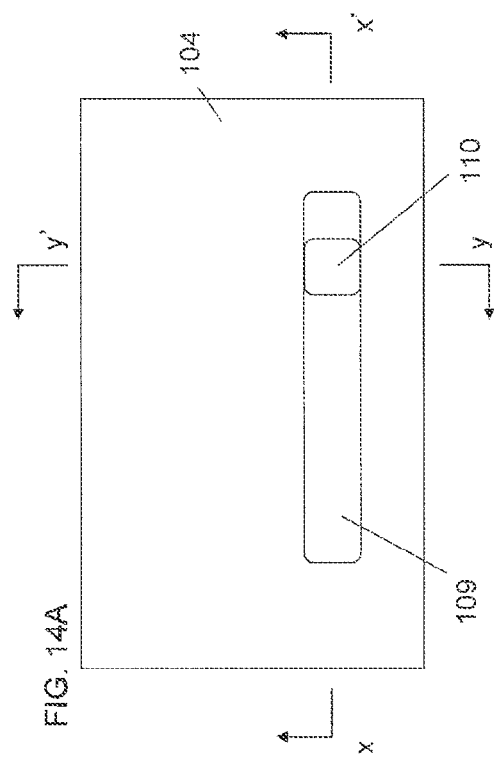
FIG. 14A is a plan view of a semiconductor device according to the present invention.
Figure 14B:
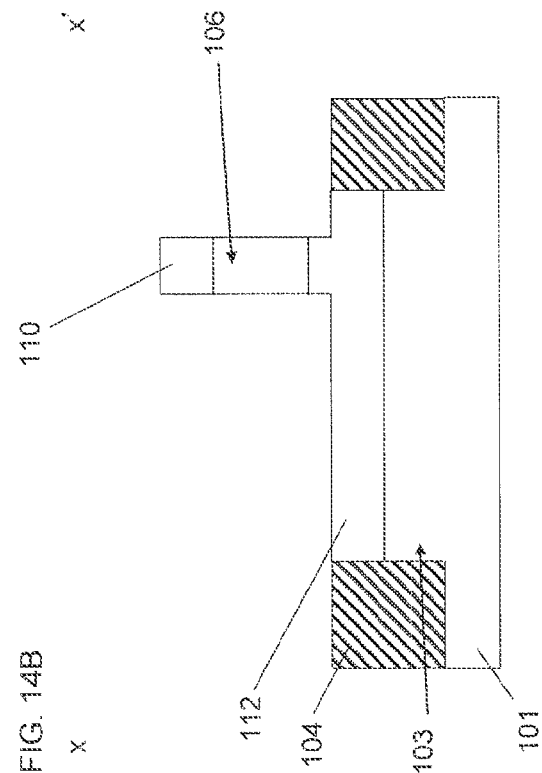
FIG. 14B is a cross-sectional view taken along line X-X' in FIG. 14A.
Figure 14C:
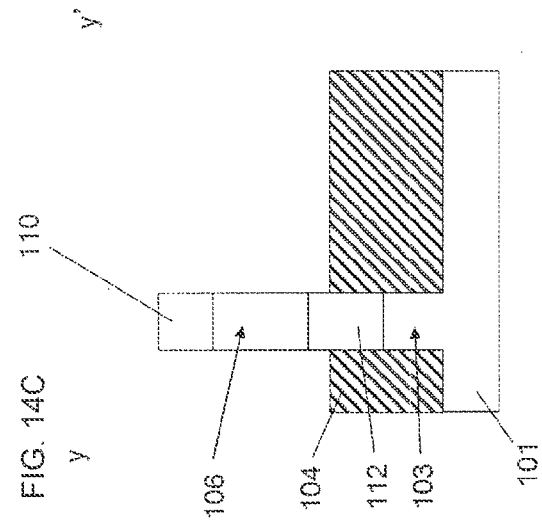
FIG. 14C is a cross-sectional view taken along line Y-Y' in FIG. 14A.

Referring now to FIGS. 14A-14C, a heat-treatment is performed. The diffusion layers 109 and 111 in the upper portion of the fin-shaped silicon layer 103 come into contact with each other so as to form a diffusion layer 112. As a result of the above-described steps, an impurity is implanted into the upper portion of the pillar-shaped silicon layer 106, the upper portion of the fin-shaped silicon layer 103, and the lower portion of the pillar-shaped silicon layer 106 so as to form the diffusion layers 110 and 112.

A method for preparing a polysilicon gate electrode, a polysilicon gate line, and a polysilicon gate pad by using polysilicon will now be described. According to this method, an interlayer insulating film is first deposited and then a polysilicon gate electrode, a polysilicon gate line, and a polysilicon gate pad are exposed by chemical mechanical polishing (CMP). Thus, it is essential that the upper portion of the pillar-shaped silicon layer remain unexposed despite CMP.

In other words, as shown in FIGS. 15A-15C, a gate insulating film 113 is formed, a polysilicon 114 is deposited, and the surface thereof is planarized. The upper surface of the polysilicon 114 after planarization is to come at a position higher than the gate insulating film 113 on the diffusion layer 110 in the upper portion of the pillar-shaped silicon layer 106. In this manner, the upper portion of the pillar-shaped silicon layer can remain unexposed despite CMP, during which a polysilicon gate electrode 114a, a polysilicon gate line 114b, and a polysilicon gate pad 114c become exposed and which is performed after deposition of the interlayer insulating film.

Next, a second nitride film 115 is deposited. The second nitride film 115 prevents formation of a silicide in the upper portions of the polysilicon gate electrode 114a, polysilicon gate line 114b, and polysilicon gate pad 114c during the process of forming a silicide in the upper portion of the fin-shaped silicon layer 103.

Next, as shown in FIGS. 16A-16C, a third resist 116 for forming the polysilicon gate electrode 114a, the polysilicon gate line 114b, and the polysilicon gate pad 114c is formed. The polysilicon gate pad 114c is preferably arranged so that the part that forms a gate line perpendicularly intersects the fin-shaped silicon layer 103 in order to decrease the parasitic capacitance between the gate line and the substrate. The width of the polysilicon gate electrode 114a and the width of the polysilicon gate pad 114c are preferably larger than the width of the polysilicon gate line 114b.

Then, as shown in FIGS. 17A-17C, the second nitride film 115 is formed by etching.

Then, as shown in FIGS. 18A-18C, the polysilicon 114 is etched to form the polysilicon gate electrode 114a, the polysilicon gate line 114b, and the polysilicon gate pad 114c.

Then, as shown in FIGS. 19A-19C, the gate insulating film 113 is etched so as to remove the bottom portion of the gate insulating film 113.

Figure 20A:
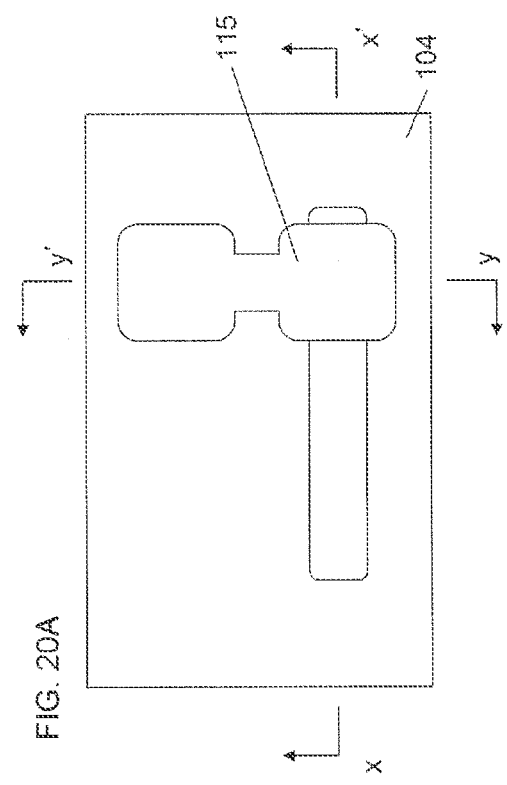
FIG. 20A is a plan view of a semiconductor device according to the present invention.
Figure 20B:
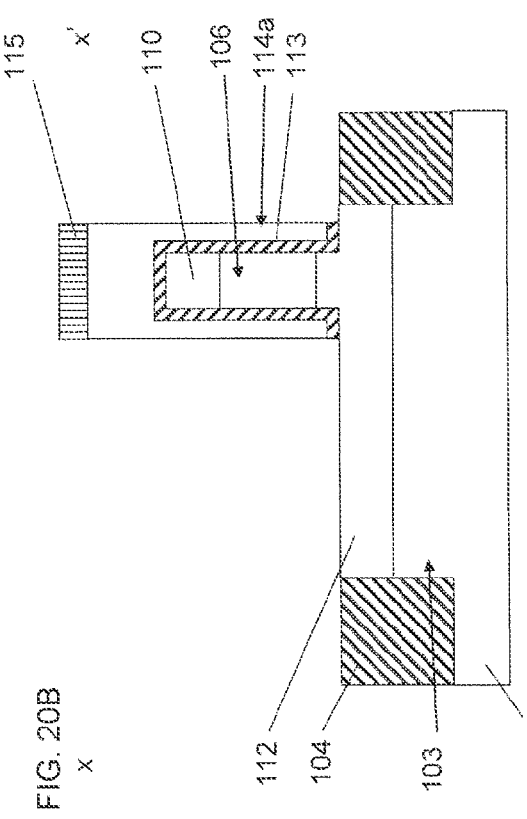
FIG. 20B is a cross-sectional view taken along line X-X' in FIG. 20A.
Figure 20C:
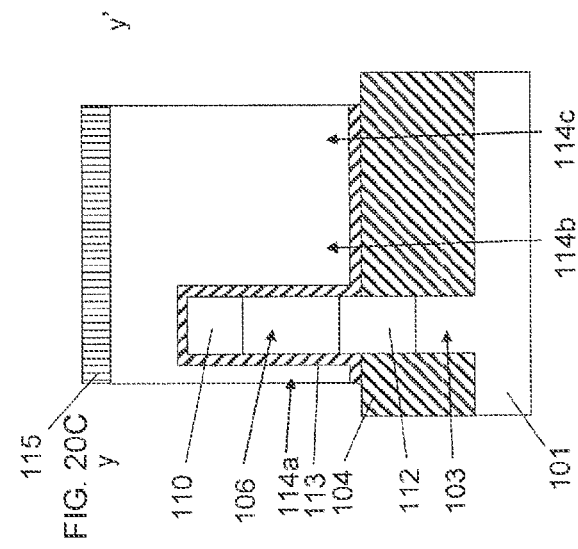
FIG. 20C is a cross-sectional view taken along line Y-Y' in FIG. 20A.

Then, as shown in FIGS. 20A-20C, the third resist 116 is removed.

The polysilicon gate electrode 114a, the polysilicon gate line 114b, and the polysilicon gate pad 114c are thus formed through the steps described above.

The upper surface of the polysilicon after forming the polysilicon gate electrode 114a, the polysilicon gate line 114b, and the polysilicon gate pad 114c is located at a position higher than the gate insulating film 113 on the diffusion layer 110 in the upper portion of the pillar-shaped silicon layer 106.

A method for forming a silicide in the upper portion of the fin-shaped silicon layer will now be described. This method is characterized in that no silicide is formed in the upper portions of the polysilicon gate electrode 114a, the polysilicon gate line 114b, and the polysilicon gate pad 114c, and the diffusion layer 110 in the upper portion of the pillar-shaped silicon layer 106. It is not preferable to form a silicide in the diffusion layer 110 in the upper portion of the pillar-shaped silicon layer 106 since the number of steps in the method will increase.

First, as shown in FIGS. 21A-21C, a third nitride film 117 is deposited.

Next, as shown in FIGS. 22A-22C, the third nitride film 117 is etched to be left as a sidewall.

Figure 23A:
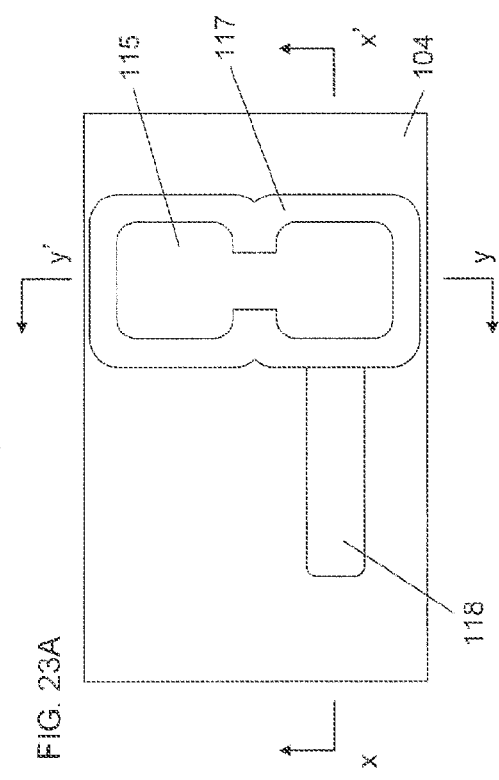
FIG. 23A is a plan view of a semiconductor device according to the present invention.
Figure 23C:
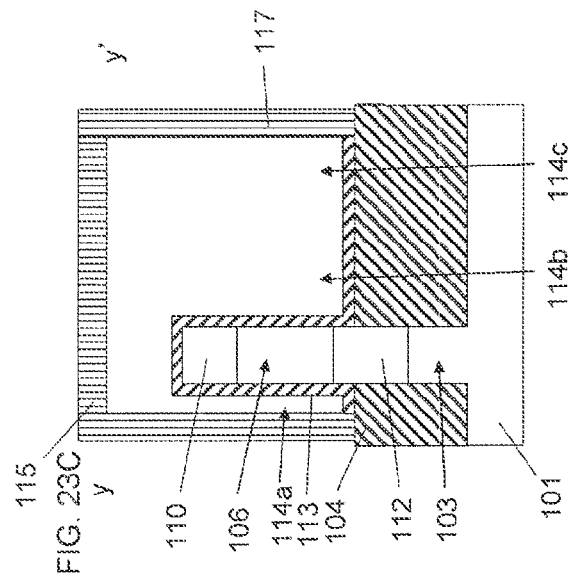
FIG. 23C is a cross-sectional view taken along line Y-Y' in FIG. 23A.
Figure 23B:
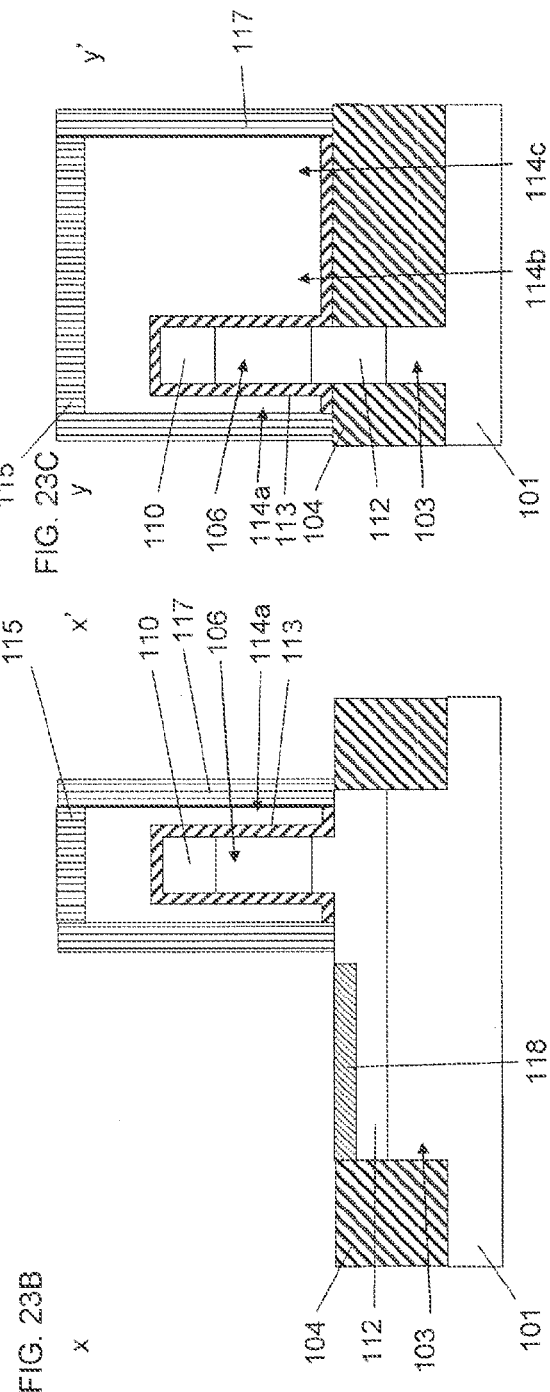
FIG. 23B is a cross-sectional view taken along line X-X' in FIG. 23A.

Then, as shown in FIGS. 23A-23C, a metal such as nickel or cobalt is deposited to form a silicide 118 in the upper portion of the diffusion layer 112 in the upper portion of the fin-shaped silicon layer 103. Since the polysilicon gate electrode 114a, the polysilicon gate line 114b, and the polysilicon gate pad 114c are covered with the third nitride film 117 and the second nitride film 115 and the diffusion layer 110 in the upper portion of the pillar-shaped silicon layer 106 is covered with the gate insulating film 113, the polysilicon gate electrode 114a, and the polysilicon gate line 114b, no silicide is formed in these parts.

Through the steps described above, a silicide is formed in the upper portion of the fin-shaped silicon layer 103.

Next, a gate-last production process in which, after an interlayer insulating film is deposited on the structure obtained through the steps described above, the polysilicon gate electrode 114a, the polysilicon gate line 114b, and the polysilicon gate pad 114c are exposed by CMP and removed by etching and then a metal is deposited is described.

First, as shown in FIGS. 24A-24C, a fourth nitride film 119 is deposited to protect the silicide 118.

Next, as shown in FIGS. 25A-25C, an interlayer insulating film 120 is deposited and the surface thereof is planarized by CMP.

Then, as shown in FIGS. 26A-26C, the polysilicon gate electrode 114a, the polysilicon gate line 114b, and the polysilicon gate pad 114c are exposed by CMP.

Figure 27A:
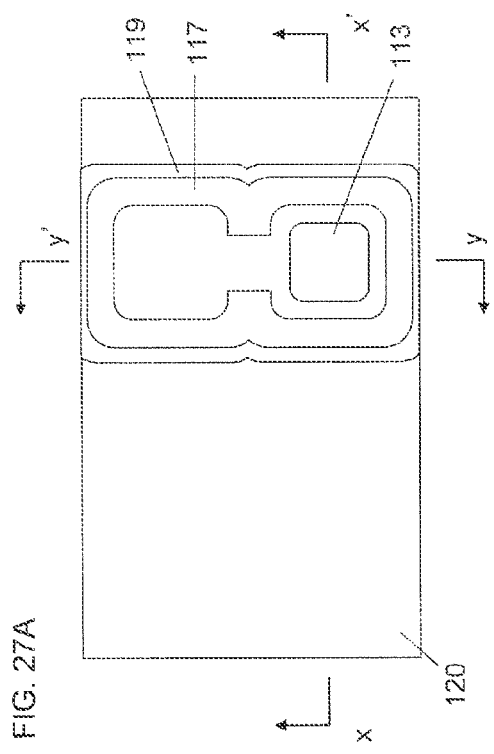
FIG. 27A is a plan view of a semiconductor device according to the present invention.
Figure 27B:
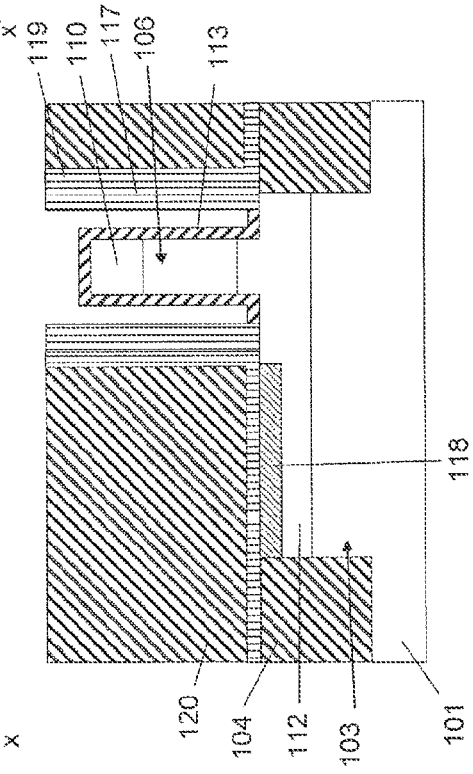
FIG. 27B is a cross-sectional view taken along line X-X' in FIG. 27A.
Figure 27C:
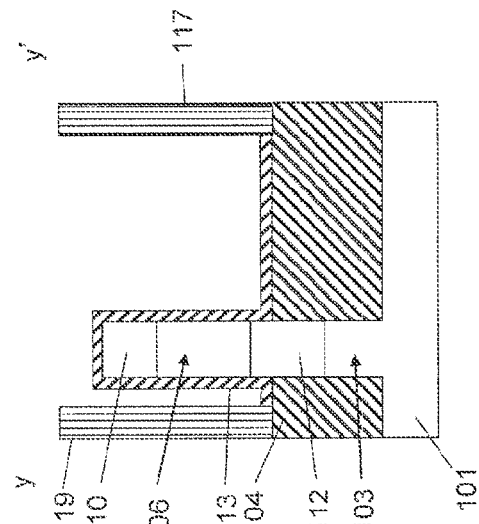
FIG. 27C is a cross-sectional view taken along line Y-Y' in FIG. 27A.

Then, as shown in FIGS. 27A-27C, the polysilicon gate electrode 114a, the polysilicon gate line 114b, and the polysilicon gate pad 114c are etched. They are preferably wet-etched.

Figure 28C:
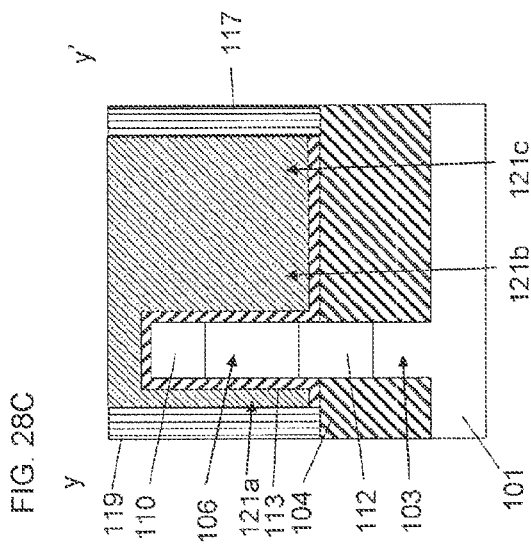
FIG. 28C is a cross-sectional view taken along line Y-Y' in FIG. 28A.
Figure 28A:
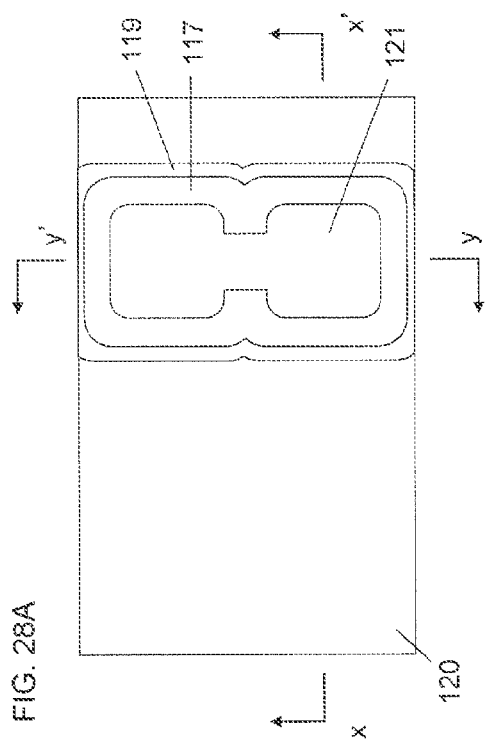
FIG. 28A is a plan view of a semiconductor device according to the present invention.
Figure 28B:
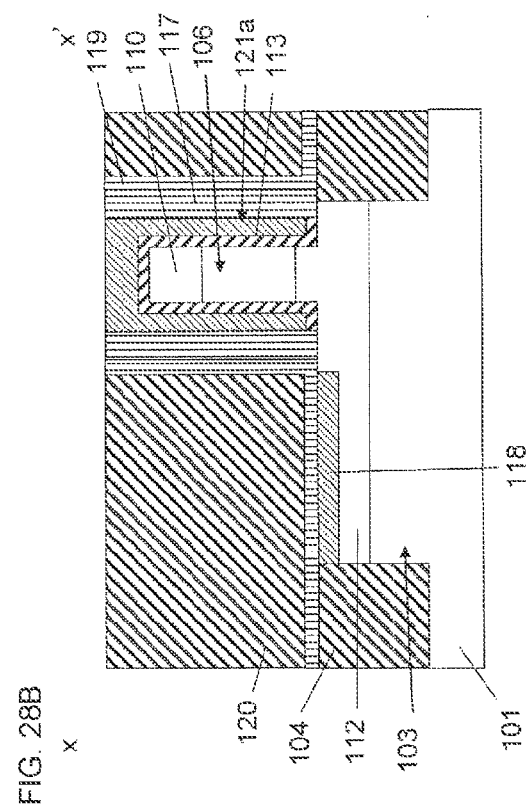
FIG. 28B is a cross-sectional view taken along line X-X' in FIG. 28A.

Then, as shown in FIGS. 28A-28C, a metal 121 is deposited and the surface thereof is planarized so as to fill the spaces where the polysilicon gate electrode 114a, the polysilicon gate line 114b, and the polysilicon gate pad 114c had existed with the metal 121. Atomic layer deposition is preferably employed to fill the spaces.

Then, as shown in FIGS. 29A-29C, the metal 121 is etched to expose the gate insulating film 113 on the diffusion layer 110 in the upper portion of the pillar-shaped silicon layer 106. As a result, a metal gate electrode 121a, a metal gate line 121b, and a metal gate pad 121c are formed.

The steps described above constitute the method for producing a semiconductor device by a gate-last technique of depositing metal layers after etching the polysilicon gate exposed by CMP after deposition of the interlayer insulating film.

A method for forming contacts will now be described. Here, since no silicide is formed in the diffusion layer 110 in the upper portion of the pillar-shaped silicon layer 106, the contact is directly connected to the diffusion layer 110 in the upper portion of the pillar-shaped silicon layer 106.

That is, first, as shown in FIGS. 30A-30C, a fifth nitride film 122 is deposited so that the fifth nitride film 122 is thicker than a half of the width of the polysilicon gate line 114b and thinner than a half of the width of the polysilicon gate electrode 114a and a half of the width of the polysilicon gate pad 114c. As a result, contact holes 123 and 124 are formed on the pillar-shaped silicon layer 106 and the metal gate pad 121c. The fifth nitride film 122 and the gate insulating film 113 at the bottom portions of the contact holes 123 and 124 will be removed by a subsequent step of etching the nitride film. Accordingly, a mask for forming the contact hole 123 on the pillar-shaped silicon layer and the contact hole 124 on the metal gate pad 121c is not needed.

Next, as shown in FIGS. 31A-31C, a fourth resist 125 for forming a contact hole 126 on the fin-shaped silicon layer 103 is formed.

Then, as shown in FIGS. 32A-32C, the fifth nitride film 122 and the interlayer insulating film 120 are etched to form the contact hole 126.

Figure 33A:
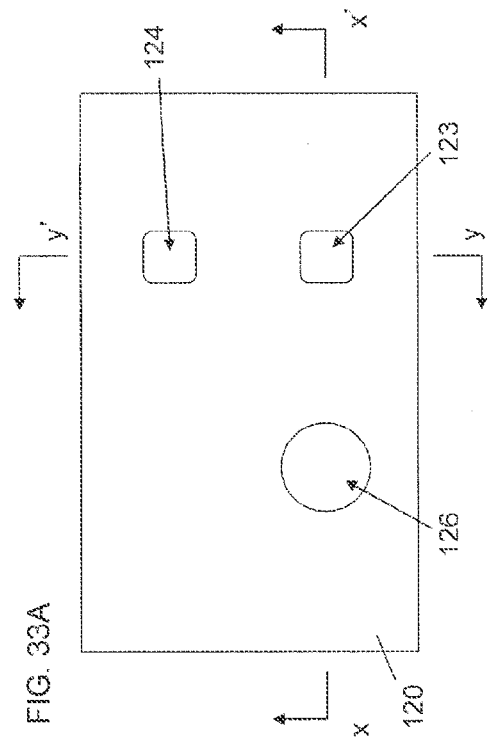
FIG. 33A is a plan view of a semiconductor device according to the present invention.
Figure 33B:
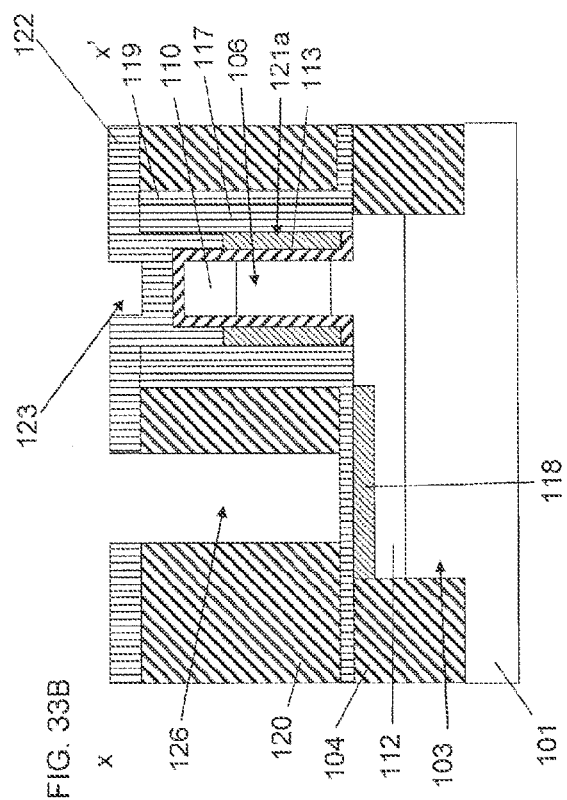
FIG. 33B is a cross-sectional view taken along line X-X' in FIG. 33A.
Figure 33C:
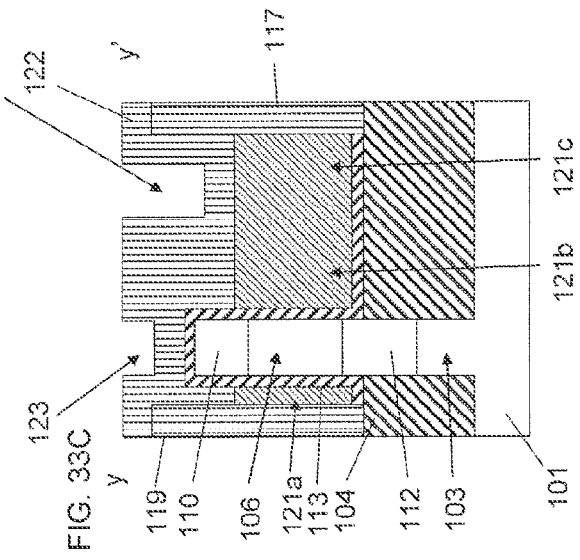
FIG. 33C is a cross-sectional view taken along line Y-Y' in FIG. 33A.

Then, as shown in FIGS. 33A-33C, the fourth resist 125 is removed.

Then, as shown in FIGS. 34A-34C, the fifth nitride film 122, the fourth nitride film 119, and the gate insulating film 113 are etched to expose the silicide 118 and the diffusion layer 110.

Then, as shown in FIGS. 35A-35C, a metal is deposited to form contacts 127, 128, and 129.

Through the steps described above, the contacts 127, 128, and 129 can be formed in the semiconductor device. According to this production method, no silicide is formed in the diffusion layer 110 in the upper portion of the pillar-shaped silicon layer 106 and thus the contact 128 is directly connected to the diffusion layer 110 in the upper portion of the pillar-shaped silicon layer 106.

The method for forming metal wiring layers will now be described.

First, as shown in FIGS. 36A-36C, a metal 130 is deposited.

Next, as shown in FIGS. 37A-37C, fifth resists 131, 132, and 133 for forming metal wirings are formed.

Then, as shown in FIGS. 38A-38C, the metal 130 is etched to form metal wirings 134, 135, and 136.

Then, as shown in FIGS. 39A-39C, the fifth resists 131, 132, and 133 are removed.

Through the steps described above, the metal wirings 134, 135, and 136 which constitute metal wiring layers are formed.

A semiconductor device produced by the production method described above is shown in FIGS. 1A-1C.

The semiconductor device shown in FIGS. 1A-1C includes the fin-shaped silicon layer 103 formed on the silicon substrate 101, the first insulating film 104 formed around the fin-shaped silicon layer 103, the pillar-shaped silicon layer 106 formed on the fin-shaped silicon layer 103, the width of the pillar-shaped silicon layer 106 being equal to the width of the fin-shaped silicon layer 103, and the diffusion layer 112 formed in the upper portion of the fin-shaped silicon layer 103 and in the lower portion of the pillar-shaped silicon layer 106.

The semiconductor device shown in FIGS. 1A-1C further includes the diffusion layer 110 formed in the upper portion of the pillar-shaped silicon layer 106, the silicide 118 formed in the upper portion of the diffusion layer 112 in the upper portion of the fin-shaped silicon layer 103, the gate insulating film 113 formed around the pillar-shaped silicon layer 106, the metal gate electrode 121a formed around the gate insulating film, the metal gate line 121b extending in a direction perpendicular to the fin-shaped silicon layer 103 and being connected to the metal gate electrode 121a, and the metal gate pad 121c connected to the metal gate line 121b. The width of the metal gate electrode 121a and the width of the metal gate pad 121c are larger than the width of the metal gate line 121b.

The semiconductor device shown in FIGS. 1A-1C has a structure in which the contact 128 is formed on the diffusion layer 110 and the diffusion layer 110 is directly connected to the contact 128.

In sum, according to this embodiment of the present invention, a method for producing a SGT, which is a gate-last process capable of decreasing the parasitic capacitance between the gate line and the substrate and which uses only one mask for forming contacts is provided. A SGT structure obtained by this method is also provided.

Since the method for producing a semiconductor device of the embodiment is based on a known method for producing FINFET, the fin-shaped silicon layer 103, the first insulating film 104, and the pillar-shaped silicon layer 106 can be easily formed.

According to a known method, a silicide is formed in the upper portion of a pillar-shaped silicon layer. Since the polysilicon deposition temperature is higher than the temperature for forming the silicide, the silicide needs to be formed after forming the polysilicon gate. Thus, in the case where a silicide is to be formed in the upper portion of a silicon pillar, the steps of forming a polysilicon gate, forming a hole in the upper portion of the polysilicon gate electrode, forming a sidewall with an insulating film on the sidewall of that hole, forming a silicide, and filling the hole with an insulating film are needed. Thus, there is a problem in that the number of steps in the method will increase.

In contrast, according to the embodiment described above, diffusion layers are formed before forming the polysilicon gate electrode 114a and the polysilicon gate line 114b and the pillar-shaped silicon layer 106 is covered with the polysilicon gate electrode 114a so that the silicide is formed in the upper portion of the fin-shaped silicon layer 103 only. Then a gate is formed with a polysilicon, the interlayer insulating film 120 is deposited, the polysilicon gate is exposed by chemical mechanical polishing (CMP), and then the polysilicon gate is etched, followed by deposition of a metal. Such a metal-gate-last production method can be used in this embodiment. Thus, according to this method for producing a semiconductor device, a SGT having a metal gate can be easily produced.

The width of the polysilicon gate electrode 114a and the width of the polysilicon gate pad 114c are larger than the width of the polysilicon gate line 114b. Furthermore, the fifth nitride film 122 thicker than a half of the width of the polysilicon gate line 114b and thinner than a half of the width of the polysilicon gate electrode 114a and a half of the width of the polysilicon gate pad 114c are deposited in a hole formed by etching the polysilicon gate after forming the metal gate. Thus, the contact holes 123 and 124 can be formed on the pillar-shaped silicon layer 106 and the metal gate pad 121c, and thus a conventionally required etching step that forms a contact hole in the pillar-shaped silicon layer through a mask is no longer needed. In other words, only one mask is needed to form contacts.

It should be understood that various other embodiments and modifications are possible without departing from the spirit and scope of the present invention in a broad sense. The embodiment described above is merely illustrative and does not limit the scope of the present invention.

The invention claimed is:

1. A semiconductor device comprising:
   a pillar-shaped silicon layer on a fin-shaped silicon layer;
   a gate insulating film around the pillar-shaped silicon layer;
   a metal gate electrode around the gate insulating film;
   a metal gate line extending in a direction perpendicular to the fin-shaped silicon layer and connected to the metal gate electrode;
   a contact on the metal gate line; and
   a nitride film on an entire top surface of the metal gate electrode and the metal gate line except the bottom of the contact and a nitride film on the sidewall of the metal gate electrode and gate line;
   wherein a vertical thickness of the nitride film on the entire top surface of the metal gate electrode and the metal gate line relative to the substrate is greater than a horizontal thickness of the nitride film on the sidewall of the metal gate electrode and gate line relative to the substrate.

\* \* \* \* \*